United States Patent [19]
Yamamoto et al.

[11] Patent Number: 6,078,707
[45] Date of Patent: Jun. 20, 2000

[54] WAVEGUIDE-PHOTODETECTOR, METHOD FOR PRODUCING THE SAME, WAVEGUIDE USABLE IN THE WAVEGUIDE-PHOTODETECTOR, AND METHOD FOR PRODUCING THE SAME

[75] Inventors: Hiroyuki Yamamoto, Tenri; Yoshio Yoshida, Nara; Motohiko Yamamoto, Ikoma-gun; Yukio Kurata, Tenri, all of Japan

[73] Assignee: Sharp Kabushiki Kaisha, Osaka, Japan

[21] Appl. No.: 08/717,355

[22] Filed: Sep. 20, 1996

[30] Foreign Application Priority Data

Sep. 22, 1995 [JP] Japan .................................. 7-244918
Nov. 30, 1995 [JP] Japan .................................. 7-312919

[51] Int. Cl.[7] .................................................... G02B 6/12
[52] U.S. Cl. .......................... 385/14; 385/132; 257/435; 257/461
[58] Field of Search ........................... 385/14, 1, 2, 132; 359/248; 257/434, 435, 461–464

[56] References Cited

U.S. PATENT DOCUMENTS

| | | | |
|---|---|---|---|
| 3,896,305 | 7/1975 | Ostrowsky et al. | 250/227 |
| 4,789,642 | 12/1988 | Lorenzo et al. | 437/24 |
| 5,134,671 | 7/1992 | Koren et al. | 385/14 |
| 5,199,090 | 3/1993 | Bell | 385/33 |
| 5,235,589 | 8/1993 | Yokomori et al. | 369/112 |
| 5,360,982 | 11/1994 | Venhuizen | 385/14 |
| 5,410,622 | 4/1995 | Okada et al. | 385/14 |
| 5,471,440 | 11/1995 | Isobe | 369/13 |

FOREIGN PATENT DOCUMENTS

| | | |
|---|---|---|
| 455802 | 2/1992 | Japan . |
| 5101476 | 4/1993 | Japan . |
| 7134216 | 5/1995 | Japan . |
| 1-463-159 | 4/1974 | United Kingdom ..................... 385/14 |

OTHER PUBLICATIONS

N. Yamaguchi et al., Journal of Lightwave Technology, vol. 8, No. 4, pp. 587–593, 1990 "Low–Loss Spot–Size Transformer by Dual Tapered Waveguides (DTW–SST)", Apr. 1990.

*Primary Examiner*—John D. Lee
*Attorney, Agent, or Firm*—Dike, Bronstein, Roberts & Cushman, LLP; David G. Conlin; William J. Daley, Jr.

[57] ABSTRACT

A waveguide-photodetector includes a semiconductor substrate; a waveguide section, provided on the semiconductor substrate, for propagating light; an opto-electric converting section, provided in the semiconductor substrate, for converting the light into an electric signal; and an insulative layer provided between the semiconductor substrate and the waveguide section. The waveguide section includes at least an introducing part for introducing the light to the waveguide section, a coupling part for coupling the light introduced to the waveguide section to the opto-electric converting section, and a propagating part for propagating the light from the introducing part to the coupling part. The insulative layer includes a first region for defining a position and a shape of an impurity diffused region of the opto-electric converting section, a second region which encloses the first region and is thicker than the first region, and a step portion between the first region and the second region. The introducing part, the propagating part and the coupling part of the waveguide section are located on the first region.

11 Claims, 15 Drawing Sheets

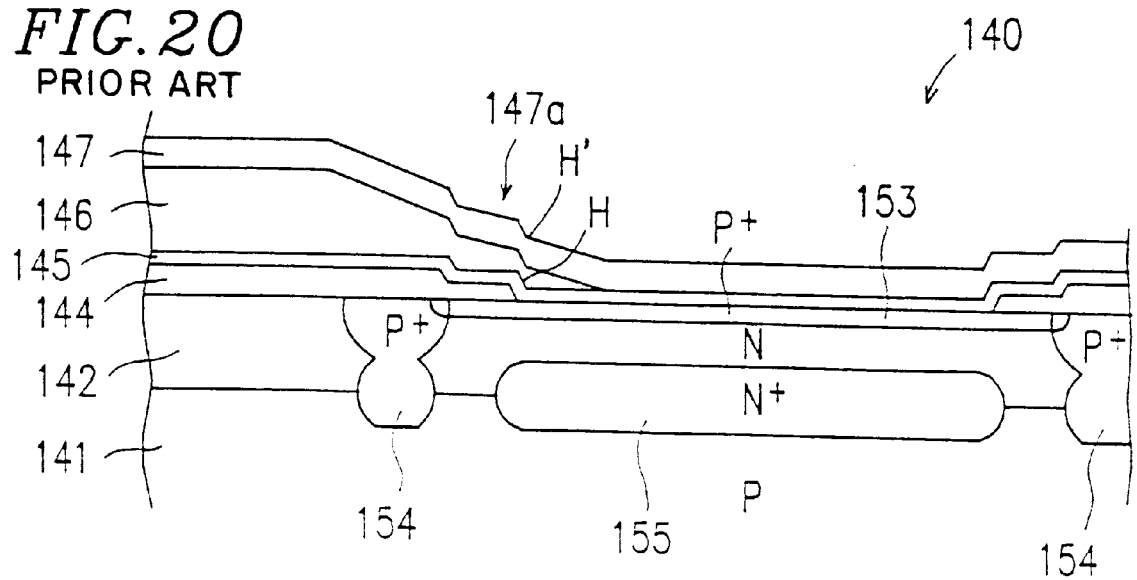

FIG. 22 PRIOR ART
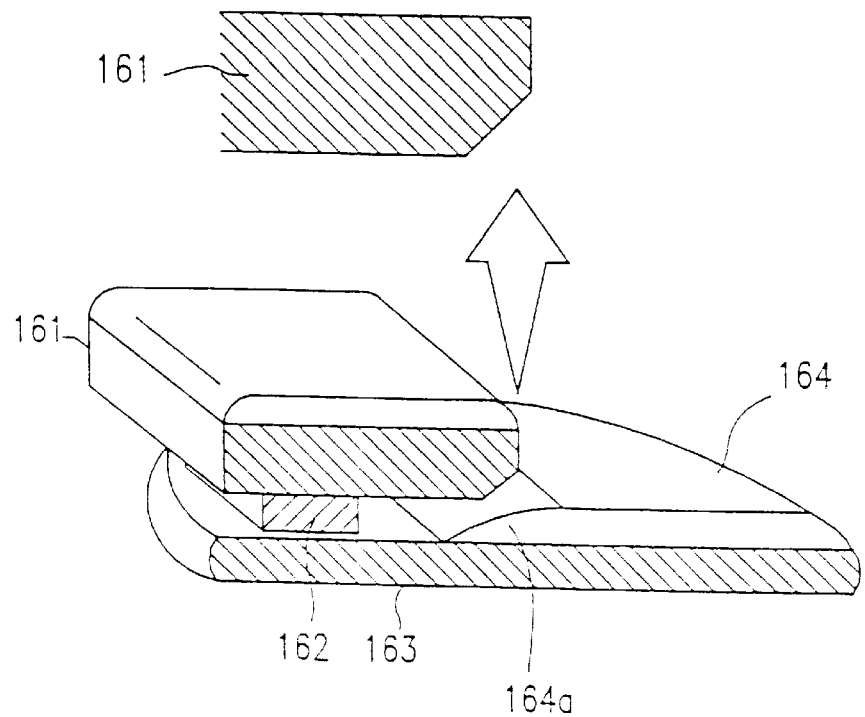
FIG. 23 PRIOR ART
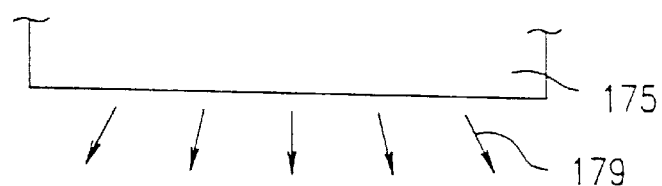
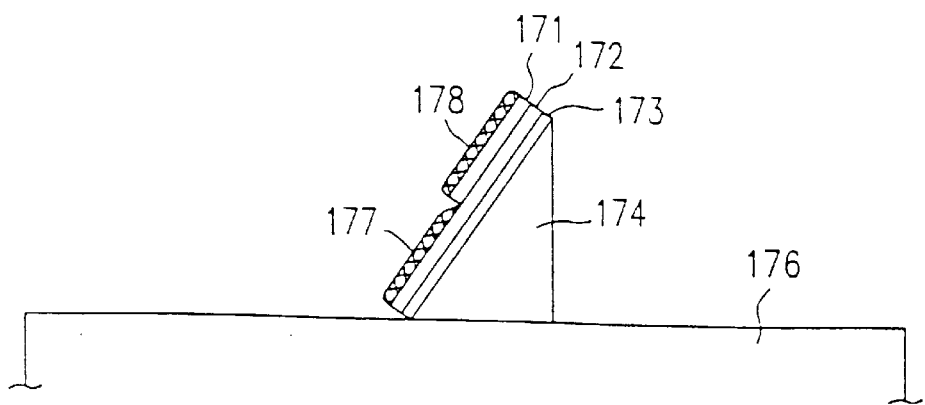

WAVEGUIDE-PHOTODETECTOR, METHOD FOR PRODUCING THE SAME, WAVEGUIDE USABLE IN THE WAVEGUIDE-PHOTODETECTOR, AND METHOD FOR PRODUCING THE SAME

BACKGROUND OF THE INVENTION

1. Field of the Invention

The present invention relates to a waveguide-photodetector including a waveguide and a photodetecting section integrally on a single substrate which is used in, for example, a magneto-optical information recording and reproduction apparatus, a method for producing the waveguide-photodetector, a waveguide having a tapered part usable in the waveguide-photodetector, and a method for producing such a waveguide.

2. Description of the Related Art

Magneto-optical disks have recently been a target of active research and development as rewritable high-density recording media. Information stored in such a magneto-optical disk is reproduced by detecting the rotation of the polarization direction of light reflected by the disk caused by the Kerr effect. In order to reproduce information stored in the magneto-optical disk with a satisfactory S/N ratio, a high-precision detector and a differential detection optical system and the like are necessary because the angle of the rotation of the polarization direction of light caused by the Kerr effect is effected on a microscopic level.

A conventional apparatus for reproducing information stored in a magneto-optical disk includes a bulk-type optical system, as an optical detection system, which includes a detector, a prism, a mirror, a lens and the like. In the bulk-type optical system, it is difficult to locate the optical elements in an appropriate positional relationship. Furthermore, the bulk-type optical system cannot be reduced in size and weight easily. In order to solve these problems, a waveguide-photodetector including a waveguide and a photodetecting section integrally on a single substrate has been proposed.

FIG. 15 is a schematic view of a conventional magneto-optical information recording and reproduction apparatus 90 including a waveguide-photodetector.

As shown in FIG. 15, the conventional magneto-optical information recording and reproduction apparatus 90 includes a light source 91 formed of a laser diode or the like, a light collection optical system including a collimator lens 93 and an objective lens 94 located so as to collect light from the light source 91 on a magneto-optical disk 92, a waveguide-photodetector 95 including a waveguide and a photodetecting section, and a prism coupler 96 provided on the waveguide-photodetector 95. The waveguide-photodetector 95 detects the light reflected by the magneto-optical disk 92. The prism coupler 96 is located on a light path between the collimator lens 93 and the objective lens 94. A bottom face of the prism coupler 96 reflects the light from the collimator lens 93 and directs the light toward the objective lens 94. The prism coupler 96 also guides the light reflected by the magneto-optical disk 92 and then transmitted through the objective lens 94 toward the waveguide-photodetector 95.

FIG. 16 is a plan view of the waveguide-photodetector 95.

In FIG. 16, a white area 97 is a first waveguide, and the prism coupler 96 is provided on the first waveguide 97. A mesh area 98 is a second waveguide, which is provided to be photocoupled to the first waveguide 97. Where the equivalent refractive index of the first waveguide 97 in the $TE_0$ mode is $Ne_1$, the equivalent refractive index of the first waveguide 97 in the $TM_0$ mode is $Nm_1$, the equivalent refractive index of the second waveguide 98 in the $TE_0$ mode is $Ne_2$, the equivalent refractive index of the second waveguide 98 in the $TM_0$ mode is $Nm_2$, $Ne_1$ is substantially equal to $Nm_1$, and the $Ne_2$ is different from $Nm_2$.

A hatched area 99 is a third waveguide which is provided in the second waveguide 98. Light propagated through the second waveguide 98 is divided into a light component in the TE mode and a light component in the TM mode at an interface between the second waveguide 98 and the third waveguide 99. The light component in the TE mode is reflected by the interface, and the light component in the TM mode is refracted by the interface. In other words, the third waveguide 99 acts as a mode separation element. As shown in FIG. 16, photodetectors 106 and 107 are respectively provided in the second waveguide 98 and the third waveguide 99 for detecting the light components in the TE mode and the TM mode, and the photodetectors 106 and 107 and the third waveguide 99 form a magneto-optical signal (MO signal) detector 108.

Photodetectors 101 and 102, and waveguide light collectors 103 and 104 for guiding the light to the photodetectors 101 and 102 are also provided on the second waveguide 98. The photodetectors 102 and 103 form a focus error signal (Fo signal) detector 105.

The conventional magneto-optical information recording and reproduction apparatus 90 operates in the following manner.

Light emitted by the light source 91 is collimated by the collimator lens 93 and is incident on the prism coupler 96. Then, the light is reflected by the bottom face of the prism coupler 96 toward the objective lens 94, and is collected on the magneto-optical disk 92 by the objective lens 94. The light reflected by the magneto-optical disk 92 is transmitted through the objective lens 94 and is incident on the prism counter 96 again. Then, the light is coupled to the first waveguide 97 in the waveguide-photodetector 95.

Thereafter, the light is propagated through the first waveguide 97, is coupled to the second waveguide 98, and is propagated through the second waveguide 98. Then, a part of the light is incident on the waveguide light collectors 103 and 104 and thus is guided to the photodetectors 101 and 102 to be used for detecting an Fo signal. The remaining part of the light is divided by the interface between the second waveguide 98 and the third waveguide 99 into a light component in the TE mode and a light component in the TM mode. The light components in the TE and TM modes are respectively guided to the photodetectors 106 and 107. Based on the outputs from the photodetectors 106 and 107, a magneto-optical signal is obtained.

With reference to FIG. 17A, the photodetectors 101, 102, 106 and 107 will be described.

FIG. 17A shows a cross-sectional view of an exemplary structure of a waveguide-photodetector including a waveguide and a photodetecting section on a single substrate. The photodetecting section corresponds to each of the photodetectors 101, 102, 106 and 107. In FIG. 17A, the waveguide-photodetector is indicated by reference numeral 110.

The waveguide-photodetector 110 includes an $N^+$–Si substrate 111 and an $N^-$Si epitaxial layer 112 grown on the $N^+$–Si substrate 111. The $N^-$Si epitaxial layer 112 includes a $P^+$ region 112a formed by doping boron or the like into the $N^-$Si epitaxial layer 112. The $P^+$ region 112a acts as a part of a light receiving section of the photodetecting section.

A $SiO_2$ layer 113 is provided on the $N^-Si$ epitaxial layer 112 as a result of thermal oxidation of the $N^-Si$ epitaxial layer 112. An area 113a of the $SiO_2$ layer 113 which is on the $P^+$ region 112a is thinner than the rest of the $SiO_2$ layer 113. The $SiO_2$ layer 113 acts as a buffer layer. On the $SiO_2$ layer 113, a waveguide layer 114 formed of the first waveguide 97 or the second waveguide 98, or a waveguide layer 114' in which the first waveguide 97 and the second waveguide 98 are integrated is provided. In the following description, only the waveguide layer 114 will be mentioned for simplicity. An electrode interconnection 115 is provided on a part of the waveguide layer 114. The $SiO_2$ layer 113 and the waveguide layer 114 have an opening 114a reaching the $P^+$ region 112a. The electrode interconnection 115 is electrically connected to the $P^+$ region 112a through the opening 114a. A gap layer 116 is provided on the waveguide layer 114 so as to cover the electrode interconnection 115. A rear electrode 117 is provided on a surface of the $N^+$—Si substrate 111 opposite the surface on which the $N^-Si$ epitaxial layer 112 is provided.

The waveguide-photodetector 110 having such a structure is generally produced in the following manner.

On the $N^+$—Si substrate 111 formed of single crystalline $N^+$ silicon, the $N^-$—Si layer 112 is epitaxially grown. A surface area of the $N^-$—Si layer 112 is thermally oxidized to form the $SiO_2$ layer 113 thereon. An area of the $SiO_2$ layer 113 in which the light receiving section of the photodetecting section is to be formed is removed by etching or the like, thereby forming an opening. The resultant layers are kept in a high-temperature atmosphere including impurities such as boron, thereby diffusing the impurities into the $N^-$—Si epitaxial layer 112 from the opening of the $SiO_2$ layer 113. Thus, the $P^+$ region 112a is formed. While the layers are kept in the high-temperature atmosphere, another $SiO_2$ layer is formed, which is the area 113a thinner than the rest of the $SiO_2$ layer 113 shown in FIG. 17A.

Next, on the $SiO_2$ layer 113, the waveguide layer 114 formed of the first or second waveguide 97 or 98 is formed. In lieu of the waveguide layer 114, the waveguide layer 114' formed of the second and third waveguide layers 98 and 99 can be formed. As described above, the $SiO_2$ layer 113 acting as a buffer layer has the area 113a which is thinner than the rest thereof. As can be appreciated from an inclining surface area 113b of the $SiO_2$ layer 113, the thickness changes gradually in the vicinity of a light-incident side of the $p^+$ region 112a (left end of the $p^+$ region 112a in FIG. 17A). Namely, the $SiO_2$ layer 113 has a tapered part on the light-incident side. In accordance with the tapered part of the $SiO_2$ layer 113, the waveguide layer 114 formed on the $SiO_2$ layer 113 also has a part inclining toward the $p^+$ region 112a as a part of the light receiving section. The waveguide including the $SiO_2$ layer 113 and the waveguide layer 114 has a tapered part on the light-incident side, which improves the detection efficiency of the waveguide-photodetector 110. The tapered part on the opposite side (right side in FIG. 17A) is not related to photodetection. Exemplary methods for forming such a waveguide having a tapered part (tapered waveguide) will be described later.

After the waveguide layer 114 is formed, the opening 114a is formed through the waveguide layer 114 and the $SiO_2$ layer 113 so as to reach the $P^+$ region 112a.

On the waveguide layer 114, the electrode interconnection 115 is formed by depositing a metal material or the like and patterning the material so as to fill the opening 114a. The gap layer 116 is formed on the waveguide layer 114 so as to cover the electrode interconnection 115. On the surface of the $N^+$—Si substrate 111 opposite the surface on which the $N^-$—Si epitaxial layer 112 is provided, the rear electrode 117 is formed.

The light received by the light receiving section is converted into an electric signal corresponding to the amount of light by the photodetecting section and then is sent to an external device by the electrode interconnection 115.

As described above, the electrode interconnection 115, which is provided between the waveguide layer 114 and the gap layer 116, is electrically connected to the $P^+$ region 112a acting as a part of the light receiving section, through the opening 114a formed through the waveguide layer 114 and the $SiO_2$ layer 113 acting as a buffer layer. The gap layer 116 acts as an upper cladding layer for the waveguide layer 114 and also as a passivation layer for protecting the electrode interconnection 115 against shortcircuiting, mechanical damage, physical contamination, corrosion or the like. Since the electrode interconnection 115 is separated from the $N^+$—Si substrate 111 by the waveguide layer 114 as well as by the $SiO_2$ layer 113, the capacitance between the electrode interconnection 115 and the $N^+$—Si substrate 111 can be lower than the capacitance in a structure in which the separation is performed only by the $SiO_2$ layer 113.

FIG. 17B is a cross-sectional view showing another waveguide-photodetector 110'. In the structure shown in FIG. 17B, another gap layer 118 is provided between the electrode interconnection 115 and the waveguide layer 114. The electrode interconnection 115 is electrically connected to the $P^+$ region 112a through the opening 114a formed through the gap layer 118, the waveguide layer 114 and the $SiO_2$ layer 113 acting as a buffer layer. In such a structure, the gap layer 116 acts as a passivation layer for protecting the electrode interconnection 115 as described above, and the gap layer 118 contributes to reduction in capacitance between the electrode interconnection 115 and the $N^+$—Si substrate 111.

A tapered waveguide is useful for propagating the light in the thickness direction thereof with no loss or allowing the light to pass through the interface between two regions having different effective refractive indices with no loss. Hereinafter, the loss of light occurring during propagation in a waveguide layer will be referred to as the "propagation loss". The tapered part is formed by dry or wet etching, ion milling, mechanical processing such as cutting, or shadow masking. Shadow masking refers to covering an area of a layer and depositing another layer in a tapered manner using particles which jump to the covered area obliquely. Shadow masking can be used in known layer formation methods such as sputtering, vacuum evaporation, and CVD.

With reference to FIGS. 21A through 21I and 22, etching and shadow masking will be described. First, a method for forming a tapered part in a waveguide by etching disclosed in Japanese Laid-Open Patent Publication No. 4-55802 will be described with reference to FIGS. 21A through 21I.

A surface area of a Si substrate 191 shown in FIG. 21A is thermally oxidized to form a first $SiO_2$ layer 192 thereon as shown in FIG. 21B. The first $SiO_2$ layer 192 acts as a buffer layer. Next, as shown in FIG. 21C, a second $SiO_2$ layer 193 is deposited on the first $SiO_2$ layer 192 by spin coating. The second $SiO_2$ layer 193 can be etched faster than the first $SiO_2$ layer 192 formed by thermal oxidation. As shown in FIG. 21D, a photoresist 194 is formed on the second $SiO_2$ layer 193 and patterned as prescribed as shown in FIG. 21E. Then, the lamination formed so far is etched with an appropriate etchant. As described above, the second $SiO_2$ layer 193 is etched faster than the first $SiO_2$ layer 192. Thus, as shown in FIG. 21F, an area of the first SiO$_2$ layer 192 which is not covered with the photoresist 194 is etched away, and another area of the first SiO$_2$ layer 192 which is covered with the photoresist 194 but not covered with the second SiO$_2$ layer 193 is etched away in a tapered manner. The reason why the first SiO$_2$ layer 192 is etched away in such a manner is that the first SiO$_2$ layer 192 having a relatively low etching rate is etched away gradually and the first SiO$_2$ layer 192 is etched away in proportion to the period of time of exposure to the etchant. Then, shown in FIGS. 21G and 21H, the photoresist 194 and the second SiO$_2$ layer 193 are removed. As shown in FIG. 21I, a waveguide layer 195 is formed on the Si substrate 191 so as to cover the first SiO$_2$ layer 192 acting as a buffer layer. In this manner, a waveguide having a tapered part is formed.

With reference to FIG. 22, shadow masking will be described. FIG. 22 shows a principle of shadow masking described in Journal of Lightwave Technology (vol. 8, No. 4, pp. 587–593, April 1990).

A metal mask 161 is distanced from a substrate 163 by a spacer 162. When a material for a layer 164 to be formed is deposited from a source (not shown) of the material located above the metal mask 161, the layer 164 is formed on the substrate 163, and furthermore particles of the material go into a space below the mask 161 because the particles jump obliquely as well as perpendicularly toward the substrate 163. Thus, the layer 164 has a tapered part 164a as shown in FIG. 22. The shape of the tapered part 164a depends on the shape of the horizontal cross-section of the mask 161, the distance between the mask 161 and the substrate 163, the size of the source of the material for the layer, and the distance between the source and the substrate 163.

FIG. 23 shows a method for forming a tapered part disclosed in Japanese Laid-Open Patent Publication No. 7-134216. This method uses shadow masking as described above.

A substrate 172 having a photoresist pattern 171 is located in an inclining posture between a sample table 176 and a source 175 of the material for the layer to be formed. The sample table 176 is cooled. Since the substrate 172 is distanced from the sample table 176 due to such a posture, a metal jig 174 having a satisfactory thermal conductivity is provided between the substrate 172 and the sample table 176 through a vacuum grease 173. For layer formation, particles 179 of the material are caused to jump at an angle with respect to a normal to the surface of the substrate 172, and thus the material is deposited on the substrate 172 so as to cover the photoresist pattern 171. In FIG. 23, an area of the material deposited on the photoresist pattern 171 is indicated by reference numeral 178, and an area of the material deposited directly on the substrate 172 is indicated by reference numeral 177. In an area of the substrate 172 shadowed by the photoresist pattern 171, the thickness of the material varies in correspondence with the degree to which the area is shadowed. After the material is deposited as prescribed, lift-off is performed. Specifically, the photoresist pattern 171 and the area 178 of the material, which is unnecessary, are removed by a solution such as acetone in which the photoresist can be dissolved. In this manner, the layer (area 177) having a prescribed tapered part is formed.

The above-described methods for forming the waveguide having a tapered part have the following problems.

Layer formation by vapor deposition, sputtering, CVD, or other types of deposition is advantageous over layer formation by thermal oxidation in that there is a wider range of selections for the material. However, the layer formed of a material selected from such a wide range allows grain boundaries to be generated more easily than the thermally oxidized SiO$_2$ layer. Furthermore, the layer formed by any of the above-listed methods of deposition generally has a rough surface and is porous. The surface roughness of the tapered part is raised by etching. Due to these problems, a layer formed by any of these methods loses more light than a thermally oxidized SiO$_2$ layer. Accordingly, the materials usable for forming a waveguide having a tapered part which performs properly are limited.

By the etching method described with reference to FIGS. 21A through 21I, when the second SiO$_2$ layer 193 is removed, the area of the first SiO$_2$ layer 192 which is not covered with the second SiO$_2$ layer 193 is also etched away, resulting in generating a step portion in the first SiO$_2$ layer 192. This causes propagation loss. Moreover, ions in the etchant may go into the substrate 191 or the substrate 191 may also be etched. Such influences on the substrate 191 may change the characteristics of the waveguide-photodetector.

The shadow masking method described with reference to FIG. 22 is disadvantageous both in reduction in size and integration of a photodetecting section and a waveguide. Since the mask 161 and the gap between the substrate 163 and the mask 161 are both about 1 mm, the length of the tapered part cannot be shorter than several millimeters. Furthermore, the steps of attaching and removing the mask 161 and the step of washing, for example, which are required for this method, make the mass-production of the waveguide-photodetectors difficult.

In the field of bulk-type optical systems, faster response and higher integration have been demanded for a photodetector due to the uses thereof. In this field, a photodetector is produced in parallel with ICs used in an external control circuit, and the structure of the photodetector is more complicated.

FIG. 18A is a cross-sectional view of a photodetector 120 to be produced in parallel with the ICs used in an external control circuit.

As shown in FIG. 18A, the photodetector 120 includes a p-type Si substrate 121, an n-type Si epitaxial layer 122 provided on the p-type Si substrate 121, a SiO$_2$ layer 124 provided on the n-type Si epitaxial layer 122 as a result of thermal oxidation of a surface area thereof, metal layers 129, an anti-reflection layer 125 formed of a nitride, an insulative layer 126 formed of a nitride, and a passivation layer 127 for protecting an IC and metal wires (not shown). In FIG. 18A, a lead of the electrode interconnection is omitted for simplicity. The n-type Si epitaxial layer 122 has a P$^+$ region 133 acting as a part of a light receiving section 128. The SiO$_2$ layer 124 has an opening in correspondence with the P$^+$ region 133, and a step portion 124a between the opening and the rest of the SiO$_2$ layer 124 is micrometers high. The SiO$_2$ layer 124 acts as a mask for diffusing impurities to form P$^+$ regions 133. The metal layers 129 each act as an etching stopper and also as an interconnection for an IC.

The insulative layer 126, the passivation layer 127 and the metal layers 129 can be eliminated. The anti-reflection layer 125 is indispensable for the function thereof, and the SiO$_2$ layer 124 is also indispensable for protecting the P-N junction. FIG. 18B is a cross-sectional view of a photodetector 120' having a simplest possible structure, in which the passivation layer 127, the metal layers 129 and the insulative layer 126 are eliminated. In even such a simple structure, a step portion 124a' which is about 1 μm high is unavoidable. When the photodetector 120' is used in a bulk-type optical system, light is incident on the light receiving section 128 from outside (i.e., not through a waveguide). Accordingly, such a shallow step portion 124a' does not provide any problem.

With reference to FIGS. 19A through 19E, a method for producing photodetector 120 shown in FIG. 18A will be described together with the reason why a step portion 124a is unavoidably formed in the vicinity of the light receiving section in the photodetector 120 shown in FIG. 18A.

As shown in FIG. 19A, a surface area of the n-type Si epitaxial layer 122 grown on the p-type Si substrate 121 (FIG. 18A) is thermally oxidized to form the $SiO_2$ layer 124b on the n-type Si epitaxial layer 122. The oxidation can be performed by dry oxidation or vapor oxidation. Dry oxidation refers to oxidizing the n-type Si epitaxial layer 122 in an oxygen flow. Vapor oxidation refers to oxidizing the n-type Si epitaxial layer 122 in an oxygen flow including vapor. An opening is formed in the $SiO_2$ layer 124b as shown in FIG. 19B by, for example, forming a photoresist on the $SiO_2$ layer 124b and patterning the $SiO_2$ layer 124b.

Then, impurities are diffused into the n-type Si epitaxial layer 122 from the opening by, for example, keeping the resultant layers in a high-temperature atmosphere including the impurities using the $SiO_2$ layer 124b as a mask. Thus, as shown in FIG. 19C, the $P^+$ region 133 is formed. By keeping the n-type Si epitaxial layer 122 in the high-temperature atmosphere, the n-type Si epitaxial layer 122 is thermally oxidized again to form another $SiO_2$ layer 124c also as shown in FIG. 19C.

In order to produce the photodetector 120 in parallel with the IC, a $SiO_2$ layer 124d is formed on the $SiO_2$ layer 124c and by CVD or the like as shown in FIG. 19D. The $SiO_2$ layers 124b, 124c and 124d are shown as the $SiO_2$ layer 124 in FIG. 19E. Then, as shown in FIG. 19E, an opening 134 is formed in the $SiO_2$ layer 124 by etching. The opening 134 is inevitably smaller than the opening formed on the $SiO_2$ layer 124b as shown in FIG. 19B by 2 to 3 $\mu$m along the periphery thereof due to an insufficient positioning precision of masking or an insufficient etching precision. As a result, the step portion 124a is formed.

As can be appreciated from the above description, the step portion 124a is unavoidably formed in the vicinity of the light receiving section in the photodetector 120 shown in FIG. 18A having a structure suitable for faster response and higher integration. When the structure having the step portion 124a is used for a waveguide-photodetector described above designed for faster response and higher integration, an excessively complicated shape is required for the buffer layer in the vicinity of the step portion 124a. It is difficult to form such a complicated shape with high precision.

FIG. 20 is a cross-sectional view of a waveguide-photodetector 140 including a waveguide having a tapered part. The waveguide-photodetector 140 uses the structure described above with reference to FIG. 18A. With reference to FIG. 20, a method for such a waveguide-photodetector 140 will be described.

On the p-type Si substrate 141, an n-type Si layer 142 is epitaxially grown. A surface area of the n-type Si layer 142 is thermally oxidized to form a $SiO_2$ layer 144 thereon. When an opening for forming a $p^+$ impurity diffused region 153 is formed, a step portion H is undesirably generated as described referring to FIGS. 19A through 19E. An anti-reflection layer 145 is formed on the $SiO_2$ layer 144, and a buffer layer 146 is formed thereon. In preparation for forming a waveguide layer 147 on the buffer layer 146, a top surface of the buffer layer 146 needs to be smoothed until the surface roughness thereof becomes sufficiently small to avoid an adverse influence on the propagation loss in the waveguide layer 147. Furthermore, the $SiO_2$ layer 144 needs to be processed to have a shape (thickness, propagation length, inclination, etc.) so that there is substantially no propagation loss at a step portion H. If the top surface of the buffer layer 146 is not sufficiently smooth, a tapered part 147a of the waveguide layer 147 also obtains a step portion H'. When the buffer layer 146 is thinner than the design value in the vicinity of the step portion H', the light propagated from left to right in FIG. 20 runs from the waveguide layer 147 toward the p-type Si substrate 141 or to a space outside the waveguide opposite the substrate 141, thereby decreasing the photocoupling efficiency.

In the conventional waveguide-photodetectors 110 and 110' including a waveguide and a photodetecting section on a single substrate shown in FIGS. 17A and 17B, the surface of the impurity diffused region ($P^+$ region 112a) acting as a part of the light receiving section of the photodetecting section is covered merely with, for example, the thin $SiO_2$ layer 113. Accordingly, metal ions from outside, for example, alkaline ions may reach the impurity diffused region through the thin $SiO_2$ layer 113 and exerts an adverse influence on, for example, the charge distribution at the P-N junction. Thus, the photodetecting performance of the waveguide-photodetector 110 may be degraded.

In such a structure, the impurity diffused region 112a acting as a part of the light receiving section of the photodetecting section is separated from the waveguide layer 114 also only by the thin $SiO_2$ layer 113. Accordingly, when the waveguide layer 114 is formed of a glass material including metal ions, for example, #7059 glass (produced by Corning, Inc.), the metal ions reaching the impurity diffused region 112a through the $SiO_2$ layer 113 may exert an adverse influence as described above. Optical, thermal, mechanical and electrical characteristics of glass materials may be varied by adjusting the composition thereof, and different methods of processing can be used for different compositions. However, since the metal ions in some glass materials have an adverse influence, glass materials which are usable for a waveguide-photodetector are limited.

When the waveguide layer is formed of a glass material, there are some formation methods which change the composition of the layer, make the layer porous or have other adverse influences on the resultant layer. Specifically, absorption of the light propagating in the waveguide layer by lack of oxygen and scattering of the light propagating in the waveguide layer due to an excessive surface roughness of the waveguide layer are closely related with propagation loss in the waveguide layer. Such a propagation loss can be reduced by annealing. For annealing, a temperature of as high as about 600° C. is required, which is the softening point of glass. However, when the waveguide layer is formed and annealed after an electrode interconnection is formed of aluminum or the like, the electrode interconnection may be disconnected or oxidized by the heating. In such a case, the electrode does not function properly.

For forming the electrode so as to perform properly, a satisfactory precision is required for forming an opening in the waveguide layer, the buffer layer and the gap layer. In today's waveguide-photodetectors designed for faster response and higher integration, the size of the lead of the electrode interconnection is only several micrometers wide. It is difficult to form an opening having an aspect ratio of 1:1 in the waveguide layer, the buffer layer, and the gap layer at an appropriate position with respect to such a narrow lead.

A waveguide-photodetector including a waveguide layer, a buffer layer and a gap layer integrated on a single substrate has further problems of a change in characteristics and generation of cracks which may occur due to the stress generated in the layers.

SUMMARY OF THE INVENTION

According to one aspect of the present invention, a waveguide-photodetector includes a semiconductor substrate; a waveguide section, provided on the semiconductor substrate, for propagating light; an opto-electric converting section, provided in the semiconductor substrate, for converting the light into an electric signal; and an insulative layer provided between the semiconductor substrate and the waveguide section. The waveguide section includes at least an introducing part for introducing the light to the waveguide section, a coupling part for coupling the light introduced to the waveguide section to the opto-electric converting section, and a propagating part for propagating the light from the introducing part to the coupling part. The insulative layer includes a first region for defining a position and a shape of an impurity diffused region of the opto-electric converting section, a second region which encloses the first region and is thicker than the first region, and a step portion between the first region and the second region. The introducing part, the propagating part and the coupling part of the waveguide section are located on the first region.

In one embodiment of the invention, the first region of the insulative layer is an opening.

In one embodiment of the invention, the waveguide-photodetector further includes a passivation layer, provided at least between the coupling part of the waveguide section and the opto-electric converting section, for protecting the semiconductor substrate.

Such a waveguide-photodetector can be produced by a method which includes the step of forming the passivation layer by low pressure CVD.

In one embodiment of the invention, the passivation layer is formed of silicon nitride.

In one embodiment of the invention, the waveguide section includes a dielectric layer provided on the insulative layer and a waveguide layer provided on the dielectric layer, and the dielectric layer includes at least one of a PSG layer and a BPSG layer.

In one embodiment of the invention, the dielectric layer further includes an NSG layer.

In one embodiment of the invention, the dielectric layer further includes an SOG layer.

In one embodiment of the invention, the waveguide section includes a dielectric layer provided on the insulative layer and a waveguide layer provided on the dielectric layer, and the dielectric layer includes a lamination of a plurality of layers including an NSG layer.

In one embodiment of the invention, the dielectric layer further includes an SOG layer.

In one embodiment of the invention, the waveguide section includes a dielectric layer provided on the insulative layer and a waveguide layer provided on the dielectric layer, and the dielectric layer includes a lamination of a plurality of layers including an SOG layer.

Any of the above-described waveguide-photodetectors can be produced by a method for forming an electrode for sending the electric signal from the opto-electric converting section to an external circuit, and forming the waveguide section after the formation of the electrode.

In one embodiment of the invention, the step of forming the waveguide section includes the steps of forming the dielectric layer on the insulative layer and forming the waveguide layer on the dielectric layer. The method further includes the step of removing a part of at least one of the dielectric layer and the waveguide layer, the part corresponding to an area where the electrode is to be formed.

According to another aspect of the present invention, a method for producing a waveguide including a dielectric layer and a waveguide layer includes the steps of forming the dielectric layer on a substrate; etching a part of the dielectric layer to form a tapered part; polishing the dielectric layer to smooth a surface of the dielectric layer and to cause a surface of the tapered part to be slowly curved; and forming the waveguide layer on the dielectric layer.

In one embodiment of the invention, the step of forming an SOG layer on the dielectric layer, before polishing the dielectric layer causes the surface of the tapered part to be slowly curved.

In one embodiment of the invention, the step of etching a part of the dielectric layer includes the steps of forming a layer, on the dielectric layer, having an etching rate higher than the etching rate of the dielectric layer; and forming a mask on the layer having the higher etching rate, and etching the dielectric layer and the layer having the higher etching rate.

In one embodiment of the invention, the method further includes the step of forming, before forming the dielectric layer, a passivation layer for protecting the substrate against an etchant used for etching the dielectric layer.

In one embodiment of the invention, the step of forming the passivation layer includes the step of depositing silicon nitride by low pressure CVD.

In one embodiment of the invention, the step of forming the passivation layer includes the step of depositing silicon dioxide by CVD.

In one embodiment of the invention, the method further includes the steps of forming a waveguide on a semiconductor substrate; and forming an opto-electric converting section in the semiconductor substrate. The step for forming the waveguide includes the steps of forming a dielectric layer on the semiconductor substrate; etching a part of the dielectric layer to form a tapered part; polishing the dielectric layer to smooth a surface of the dielectric layer and to cause a surface of the tapered part to be slowly curved; and forming a waveguide layer on the dielectric layer.

In one embodiment of the invention, the step of forming the opto-electric converting section includes the step of diffusing impurities into the semiconductor substrate to form an impurity diffused region. The step of forming the waveguide includes the step of forming an SOG layer on the dielectric layer, before polishing the dielectric layer, to cause the surface of the tapered part to be slowly curved. The step of polishing the dielectric layer removes a part of the SOG layer, the part being above the impurity diffused region.

In one embodiment of the invention, the step of etching a part of the dielectric layer includes the steps of forming a layer, on the dielectric layer, having an etching rate higher than the etching rate of the dielectric layer; and forming a mask on the layer having the higher etching rate, and etching the dielectric layer and the layer having the higher etching rate.

In one embodiment of the invention, the step of forming the waveguide includes the step of forming, before forming the dielectric layer, a passivation layer for protecting the semiconductor substrate against an etchant used for etching the dielectric layer at least on the impurity diffused region in the semiconductor substrate.

In one embodiment of the invention, the step of forming the passivation layer includes the step of depositing silicon nitride by low pressure CVD.

In one embodiment of the invention, the step of forming the passivation layer includes the step of depositing silicon dioxide by CVD.

A waveguide produced by any of the above-described methods can be included in a waveguide-photodetector according to the present invention.

Thus, the invention described herein makes possible the advantages of providing the following:

(1) A waveguide-photodetector including a coupling section which can be designed and formed without being restricted by a step portion located in the vicinity of the coupling section. In the coupling section, light propagated through the waveguide section is received by the opto-electric converting section.

(2) A waveguide-photodetector including a waveguide section which restricts change in characteristics thereof and can be designed relatively freely in terms of layer materials and the like.

(3) A waveguide-photodetector, in which an adverse influence on the waveguide section by a buffer layer provided between the waveguide layer and the semiconductor substrate is avoided.

(4) A method for producing a waveguide-photodetector which allows annealing to be performed for reducing the propagation loss without spoiling the performance of the waveguide-photodetector.

(5) A method for producing a waveguide-photodetector which facilitates positioning and formation of openings for sending an electric signal to a signal processing device also alleviates an adverse influence on the waveguide section by a stress generated in the buffer layer.

(6) A tapered waveguide having a relatively small surface roughness with no step portion.

(7) A method for producing a tapered waveguide which allows the tapered part to be formed by etching without increasing surface roughness or leaving any step portion and still maintains the range of usable materials to be relatively large.

(8) A method for producing a tapered waveguide which causes substantially no damage to the semiconductor substrate during the formation of the tapered part and thus is suitable for mass-production of the tapered waveguide.

These and other advantages of the present invention will become apparent to those skilled in the art upon reading and understanding the following detailed description with reference to the accompanying figures.

BRIEF DESCRIPTION OF THE DRAWINGS

FIG. 20 is a cross-sectional view of a conventional waveguide-photodetector including a waveguide having a tapered part;

FIG. 22 is an isometric view illustrating a conventional method for forming a waveguide having a tapered part by shadow masking; and FIG. 23 is an isometric view illustrating another conventional method for forming a waveguide having a tapered part by shadow masking.

DESCRIPTION OF THE PREFERRED EMBODIMENTS

Hereinafter, the present invention will be described by way of illustrative examples with reference to the accompanying drawings.

EXAMPLE 1

A waveguide-photodetector 100 in a first example according to the present invention will be described with reference to FIG. 1.

Figure 1:
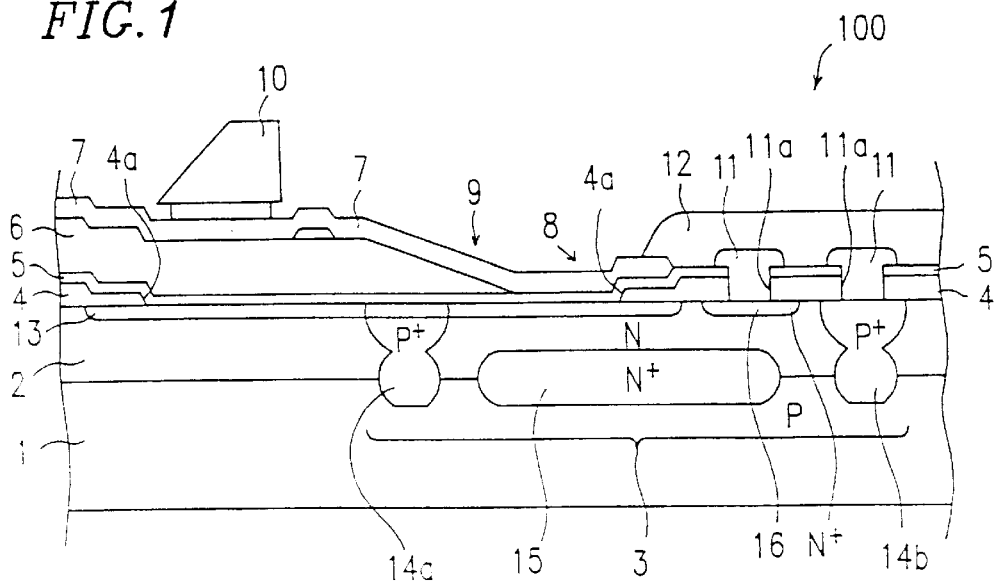
FIG. 1 is a cross-sectional view of a waveguide-photodetector in a first example according to the present invention.

FIG. 1 is a cross-sectional view of the waveguide-photodetector 100. The waveguide-photodetector 100 includes a photodetecting section including an opto-electric converting section 3 for converting received light into an electric signal, and a waveguide section for propagating light to the opto-electric converting section 3.

As shown in FIG. 1, the waveguide-photodetector 100 includes a p-type Si substrate 1 and an n-type Si epitaxial layer 2 grown thereon. In the p-type Si substrate 1 and the n-type Si epitaxial layer 2, $p^+$ impurity diffused regions 14a and 14b and an $n^+$ impurity diffused region 15 are provided. An $n^+$ impurity diffused region 16 is provided in the n-type epitaxial layer 2. The $p^+$ impurity diffused regions 14a and 14b act as isolation regions for isolating one segment from another. A $SiO_2$ layer 4 is provided on the n-type Si epitaxial layer 2 as a result of thermal oxidation of a surface area thereof. The $SiO_2$ layer 4 has an opening for defining the size and position of the $p^+$ impurity diffused region 13. When the opening is formed in the $SiO_2$ layer 4 for diffusing impurities to form a $p^+$ impurity diffused region 13, a step portion 4a is unavoidably generated in a coupling section 8 of the waveguide section. A passivation layer 5 is provided on the $p^+$ impurity diffused region 13 and the $SiO_2$ layer 4 for protection thereof against contamination. The passivation layer 5 is formed by, for example, depositing silicon nitride by low pressure CVD or the like. The passivation layer 5 can also act as an anti-reflection layer if adjusted to have an appropriate refractive index and thickness. On the passivation layer 5, a dielectric layer 6 acting as a buffer layer is provided. An end of the dielectric layer 6 which is located above the $p^+$ impurity diffused region 13 is tapered so that the dielectric layer 6 becomes thinner approaching an area where the light is coupled to the opto-electric converting section 3 of the photodetecting section described later.

A waveguide layer 7 is provided on the passivation layer 5 so as to cover the dielectric layer 6. The waveguide layer 7 and the dielectric layer 6 form the waveguide section. The waveguide section includes the coupling section 8 for coupling the light to the opto-electric converting section 3, an introducing section where external light is introduced to the waveguide layer 7, and a propagating section for propagating the light from the introducing section to the coupling section 8. The waveguide layer 7 has a part 9 inclining in accordance with the tapered end of the dielectric layer 6. The inclining part 9 is above the $p^+$ impurity diffused region 13. In the coupling section 8 of the waveguide section, the waveguide layer 7 is separated from the $p^+$ impurity diffused region 13 only by the passivation layer 5.

On a flat part of the waveguide layer 7 which is left of the inclining part 9 in FIG. 1, a prism coupler 10 for coupling the light reflected by a magneto-optical disk (not shown) to the waveguide layer 7 is provided. In other words, an area below the prism coupler 10 acts as the introducing section of the waveguide section.

In the waveguide-photodetector 100 in the first example, an area enclosed by the step portion 4a is larger than the area where the opto-electric converting section 3 receives light from the waveguide layer 7. In the area enclosed by the step portion 4a, the introducing section, the coupling section 8 and the propagating section of the waveguide section are all provided. In other words, elements required for propagating the light to the opto-electric converting section 3 are included in the area enclosed by the step portion 4a.

On the side of the coupling section 8 of the waveguide section opposite the light-incident side, electrode interconnections 11 are provided outside an area enclosed by the step portion 4a. The waveguide layer 7 is not provided in the vicinity of the electrode interconnections 11. Furthermore, the electrodes 11 are respectively in contact with the $n^+$ impurity diffused region 16 and the $p^+$ impurity diffused region 14b in the n-type epitaxial layer 2 through openings 11a. The openings 11a are formed through the $SiO_2$ layer 4 and the passivation layer 5. Due to such a structure, an electric signal obtained by the opto-electric converting section 3 is sent to an IC or the like by the electrode interconnections 11. At positions in the n-type epitaxial layer 2 corresponding to the openings 11a, the $n^+$ impurity diffused region 16 and the $p^+$ impurity diffused region 14b are provided. A protection layer for protecting the electrodes 11 against oxidation and the like are provided on the passivation layer 5 so as to cover the electrode interconnections 11. The protection layer is formed of, for example, polyimide.

The waveguide-photodetector 100 having the above-described structure operates in the following manner.

Light reflected by the magneto-optical disk (not shown) is coupled to the waveguide layer 7 via the prism coupler 10. The light is then propagated through the waveguide layer 7 from left to right in FIG. 1, and is incident on an area of the $p^+$ impurity diffused region 13, the area acting as a part of a light receiving section of the opto-electric converting section 3 (an area below the coupling section 8 of the waveguide section), with no propagation loss. The light is then converted into an electric signal by the opto-electric converting section 3, and is sent to the electrode interconnections 11. The electric signal received by the electrode interconnections 11 is sent to the IC to be processed.

Thus, the light coupled to the waveguide layer 7 below the prism coupler 10 can be propagated to the coupling section 8 of the waveguide section without passing through an area above the step portion 4a. Accordingly, the step portion 4a does not provide any restriction for designing and processing the dielectric layer 6 and the photodetecting section. Therefore, the structure for the waveguide-photodetector 100 having the inclining part 9 can be incorporated in a photodetector used for faster response and higher integration, and a photodetector having such a structure can be improved in characteristics and performance.

In the structure shown in FIG. 1, the propagation path of light from the prism coupler 10 to the coupling section 8 of the waveguide section is located in the area enclosed by the step portion 4a. Due to such a structure, a top surface of the dielectric layer 6 covering the step portion 4a, which needs to have a surface roughness sufficiently small to have substantially no adverse influence on the propagation loss in the conventional waveguide-photodetector, need not be smoothed.

Furthermore, the passivation layer 5 is provided between the photodetecting section, including the opto-electric converting section 3 and the IC, and the dielectric layer 6. In the area where the light from the coupling section 8 of the waveguide section is received by the opto-electric converting section 3, the passivation layer 5 is provided between the $p^+$ impurity diffused region 13 and the waveguide layer 7. Thus, the opto-electric converting section 3 and the IC are protected against contamination by the material of the waveguide layer 7 or by external substances coming through the waveguide layer 7.

In order to reduce the propagation loss in the waveguide layer 7, annealing can be performed. By forming the dielectric layer 6 and the waveguide layer 7 before the electrode interconnections 11, the electrode interconnections 11 can be prevented from being spoiled by annealing.

As shown in FIG. 1, neither the dielectric layer 6 nor the waveguide layer 7 is provided on the side of the coupling section 8 of the waveguide section opposite the light-incident side, i.e., the side where the electrode interconnections 11 are provided. Accordingly, the total thickness of the layers on this side is reduced, and thus the openings 11a for connecting the electrode interconnections 11 to the opto-electric converting section 3 can be formed more easily. In this specification, the light-incident side is the left side of the coupling section 8 of the corresponding figures.

EXAMPLE 2

A waveguide-photodetector 200 in a second example according to the present invention will be described with reference to FIG. 2A.

Figure 2A:
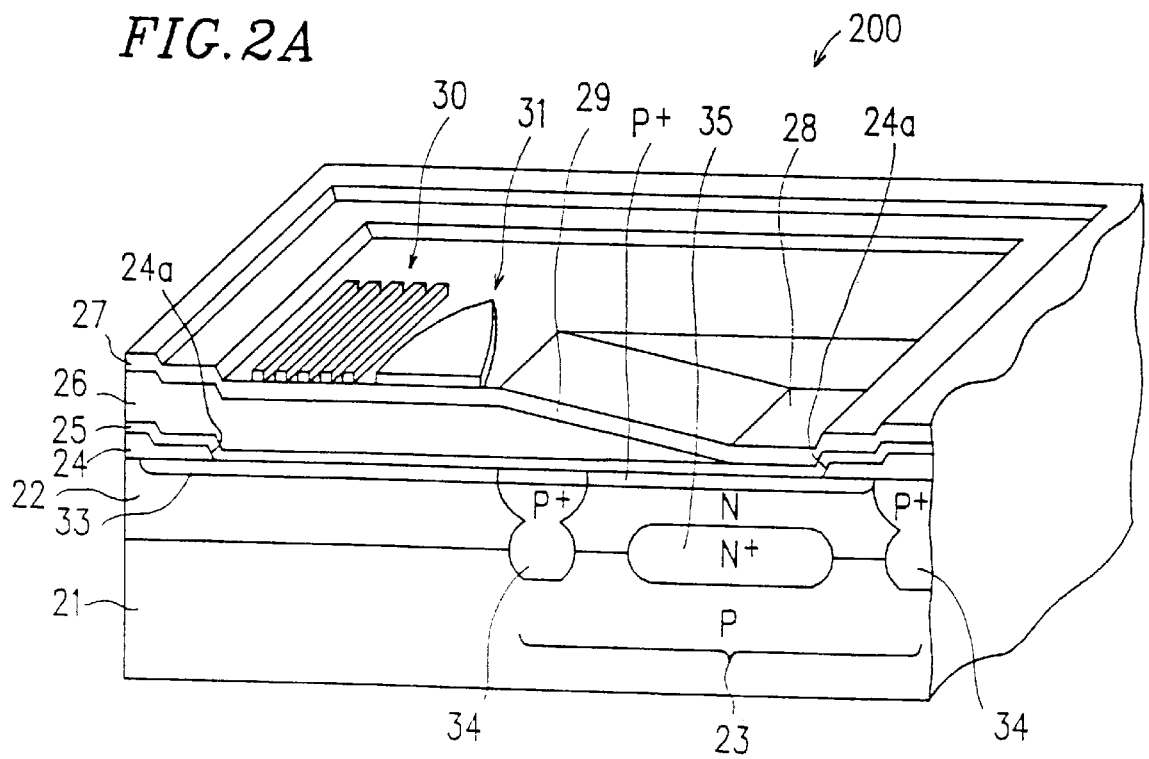
FIG. 2A is an isometric view of a waveguide-photodetector in a second example according to the present invention.

FIG. 2A is an isometric view of the waveguide-photodetector 200. The waveguide-photodetector 200 includes a waveguide layer 27 having an inclining part 29. Light propagated through the waveguide layer 27 is guided to the coupling section 28 of a waveguide section. The coupling section 28 couples the guided light to the opto-electric converting section 23.

As shown in FIG. 2A, the waveguide-photodetector 200 includes a p-type Si substrate 21 and an n-type Si epitaxial layer 22 grown thereon. In the p-type Si substrate 21 and the n-type Si epitaxial layer 22, $p^+$ impurity diffused regions 34 and an $n^+$ impurity diffused region 35 are provided. The $p^+$ impurity diffused regions 34 act as isolation regions for isolating one segment from another. On the n-type epitaxial layer 22, a $SiO_2$ layer 24 is provided as a result of thermal oxidation of a surface area of the n-type Si epitaxial layer 22. A $p^+$ impurity diffused region 33 is formed in the n-type Si epitaxial layer 22 by impurity diffusion performed using the $SiO_2$ layer 24 as a mask. Accordingly, as shown in FIG. 2A, the $p^+$ impurity diffused region 33 is larger than the area enclosed by a step portion 24a of the $SiO_2$ layer 24. A contamination prevention layer 25 is provided on the $SiO_2$ layer 24. A dielectric layer 26 acting as a buffer layer is provided on the contamination prevention layer 25. An end of the dielectric layer 26 is tapered so that the dielectric layer 26 becomes thinner approaching the area where the light is coupled to the opto-electric converting section 23. A waveguide layer 27 is provided on the dielectric layer 26, and a part 29 of the waveguide layer 27 on the tapered end of the dielectric layer 26 is inclining in accordance with the tapered end. As shown in FIG. 2A, an area adjacent to the inclining part 29 is separated from the $p^+$ impurity diffused region 33 only by the contamination prevention layer 25. The section 28 acts as a coupling section for coupling the light to the opto-electric converting section 23.

On the waveguide layer 27, a grating coupler 30 is located. By the grating coupler 30, external light is coupled to the waveguide layer 27. In other words, an area below the grating coupler 30 acts as the introducing section of the waveguide section. The light is then collected to an area of the $p^+$ impurity diffused region 33 by a waveguide lens 31, the area acting as a part of the light receiving section of the opto-electric converting section 23.

As described above, in the waveguide-photodetector 200 in the second example, a light propagation path from the grating coupler 30 to the coupling section 28 of the waveguide section is included in an area enclosed by the step portion 24a. Due to such a structure, it is not necessary to flatten a top surface of the dielectric layer 26 before the formation of the waveguide layer 27.

Although not shown in FIG. 2A, the waveguide-photodetector 200 further includes an electrode for sending an electric signal from the opto-electric converting section 23 to an IC for processing the electric signal, and an interconnection for sending the electric signal from the electrode to the IC. The electrode, the IC, and the interconnection are provided on a side of the opto-electric converting section 23 opposite the light-incident side.

EXAMPLE 3

A waveguide-photodetector 300 in a third example according to the present invention will be described with reference to FIG. 2B.

Figure 2B:
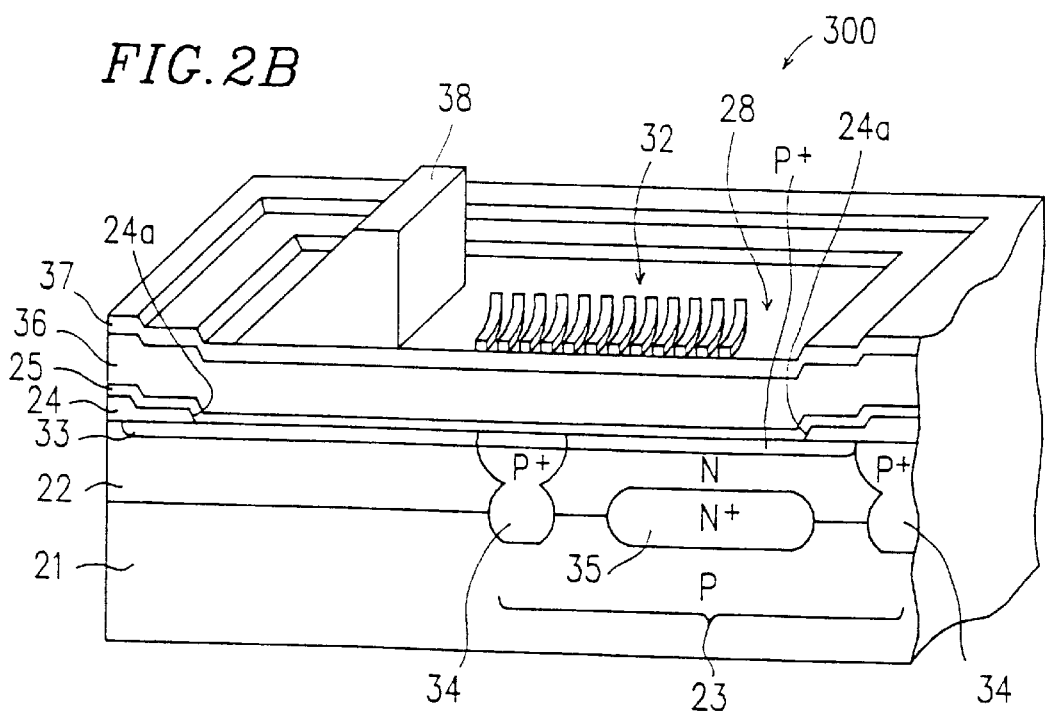
FIG. 2B is an isometric view of a waveguide-photodetector in a third example according to the present invention.

FIG. 2B is an isometric view of the waveguide-photodetector 300. Identical elements previously discussed with respect to FIG. 2A will bear identical reference numerals therewith and the descriptions thereof will be omitted.

The waveguide-photodetector 300 is different from the waveguide-photodetector 200 in the second example in the following ways.

A waveguide layer 37 does not have an inclining part and is substantially flat. A dielectric layer 36 acting as a buffer layer does not have a tapered part. On the waveguide layer 37, a prism coupler 38 for coupling external light to the waveguide layer 37 and a focusing grating coupler (FGC) 32 for coupling the light propagated through the waveguide layer 37 to the coupling section 28 of the waveguide section are provided. An area of the waveguide section below the prism coupler 38 acts as the introducing section, and an area below the FGC 32 acts as the coupling section 28.

The external light is introduced to the waveguide layer 37 by the prism coupler 38, and then is propagated through the waveguide layer 37 to reach the FGC 32. The light is diffracted by the FGC 32 and is collected to an area of the $p^+$ impurity diffused region, the area acting as a part of the light receiving section of the opto-electric converting section 23.

Due to such a structure, the external light coupled to the waveguide layer 37 reaches the coupling section 28 without passing through an area above the step portion 24a. Accordingly, it is not necessary to flatten a top surface of the dielectric layer 36 before the formation of the waveguide layer 37. The step portion of the dielectric layer 36 which is unavoidably formed by the influence of the step portion 24a can be left as it is with no harm.

Although not shown in FIG. 2B, the waveguide-photodetector 300 further includes an electrode for sending an electric signal from the opto-electric converting section 23 to an IC for processing the electric signal, and an interconnection for sending the electric signal from the electrode to the IC. The electrode, the IC and the interconnection are provided on a side of the opto-electric converting section 23 opposite the light-incident side.

EXAMPLE 4

A waveguide-photodetector 400 in a fourth example according to the present invention will be described with reference to FIG. 3. The waveguide-photodetector 400 includes a waveguide section including a dielectric layer 46 and a waveguide layer 47, and an opto-electric converting section 43 for converting the light received from the waveguide section into an electric signal.

Figure 3:
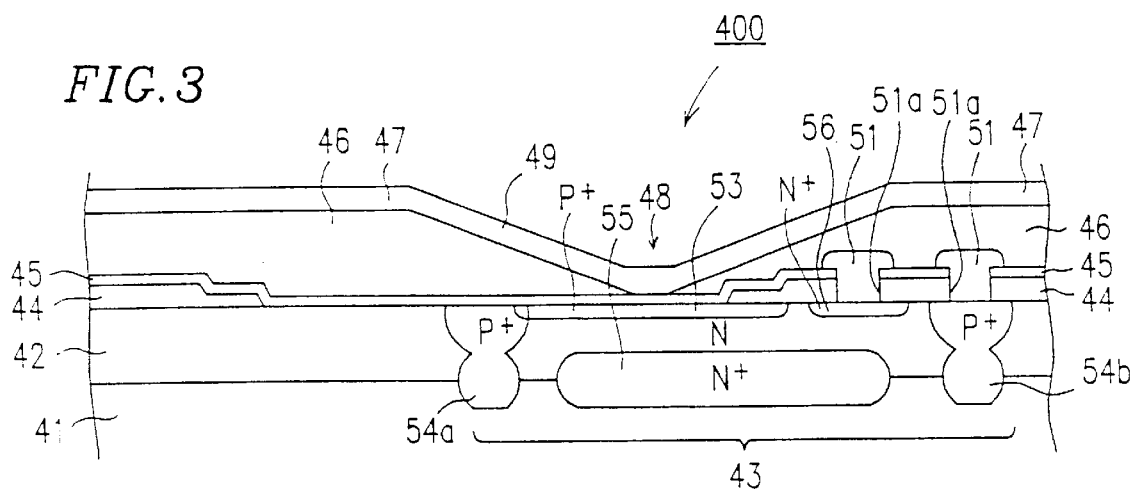
FIG. 3 is a cross-sectional view of a waveguide-photodetector in a third example and a fourth example according to the present invention.

FIG. 3 is a cross-sectional view of the waveguide-photodetector 400. The waveguide-photodetector 400 is different from the waveguide-photodetector 100 in the first example in that the dielectric layer 46 and the waveguide layer 47 forming a waveguide section are provided on two sides of an area where the light from the waveguide section is coupled to the opto-electric converting section 43. In FIG. 3, a photocoupler for coupling the external light to the waveguide layer 47 is omitted for simplicity.

The waveguide-photodetector 400 is produced in the following manner.

At a surface of a p-type Si substrate 41, a part of $p^+$ impurity diffused region 54a, a part of $p^+$ impurity diffused region 54b and an $n^+$ impurity diffused region 55 are formed. Then, an n-type Si epitaxial layer 42 is grown on the p-type Si substrate 41. A surface area of the n-type Si epitaxial layer 42 is thermally oxidized to form a $SiO_2$ layer 44 thereon. The $SiO_2$ layer 44 is etched with a prescribed pattern to form an opening. The resultant layers are kept in a high-temperature atmosphere including impurities to diffuse the impurities through the opening using the $SiO_2$ layer 44 as a mask. Thus, the remaining part of the $p^+$ impurity diffused region 54a, the remaining part of the $p^+$ impurity diffused region 54b, and an $n^+$ impurity diffused region 56 are formed. The $SiO_2$ layer 44 is once removed, and the same steps are repeated. Thus, a $p^+$ impurity diffused region 53 acting as a part of the area 48 acting as a light receiving section of the opto-electric converting section 43 is formed in the n-type Si epitaxial layer 42.

Next, a passivation layer 45 for protecting the $SiO_2$ layer 44 and the $p^+$ impurity diffused region 53 against contamination by external substances is formed thereon. Then, on the side of the region 48 acting as a coupling section of the waveguide section opposite the light-incident side, openings 51a are formed through the passivation layer 45 and the $SiO_2$ layer 44 until reaching the n-type epitaxial layer 42. After that, electrodes 51 for sending an electric signal from the opto-electric converting section 43 to an IC (not shown) for processing the electric signal are formed so as to cover the openings 51a. Thus, the electrodes 51 are put into contact with the $p^+$ impurity diffused region 54b and the $n^+$ impurity diffused region 56, which are provided in the n-type epitaxial layer 42.

Next, the dielectric layer 46 is formed on the passivation layer 45 so as to cover the electrodes 51. The waveguide layer 47 is formed on the dielectric layer 46. In the coupling section 48 of the waveguide section, the dielectric layer 46 is tapered from two directions so as to become thinner approaching the coupling section 48. The waveguide layer 47 has parts 49 in accordance with the tapered parts of the dielectric layer 46. Since the dielectric layer 46 is tapered from two directions of the coupling section 48, the waveguide layer 47 has a V-shaped cross section as shown in FIG. 3. At the bottom of the V-shaped waveguide layer 47, the dielectric layer 46 is not provided. In this area, the waveguide layer 47 is separated from the $p^+$ impurity diffused region 53 only by the passivation layer 45.

Then, a photocoupler or the like (not shown) is formed on the waveguide layer 47 so as to be located above the area enclosed by a step portion of the insulative $SiO_2$ layer 44. Thus, the waveguide-photodetector 400 is completed.

In the waveguide-photodetector 400 having the above-described structure, the light coupled to the waveguide layer 47 is propagated through the waveguide layer 47 having the inclining part 49 from left to right in FIG. 3 and reaches the coupling section 48 of the waveguide section. The pa impurity diffused region 53 acting as a part of the light receiving section of the opto-electric converting section 43 and the coupling section 48 are separated from each other only by the passivation layer 45. Due to such a structure, the light propagated through the waveguide layer 47 is coupled to the opto-electric converting section 43. The photocoupling efficiency to the opto-electric converting section 43 can be substantially 100% by optimizing the structure of the coupling section 48 and the vicinity thereof. An example of such an optimum structure is as follows:

Waveguide layer
  Glass waveguide section
    Refractive index: about 1.53
    Thickness: about 600 nm
  Upper cladding section
    Refractive index: about 1.43
    Thickness: about 100 nm
Inclining part
  Maximum inclining ratio: about 10° or more
  Length: about 100 $\mu$m Under the above-described conditions, the photocoupling efficiency obtained by actual measurement is about 95% or more.

In the waveguide-photodetector 400 in the fourth example, the passivation layer 45 is provided on the $SiO_2$ layer 44 used as a mask for forming the $p^+$ impurity diffused region 53. The passivation layer 45 is provided for blocking metal ions or other contaminating substances coming toward the $p^+$ impurity diffused region 53 from the dielectric layer 46 and the waveguide layer 47 and coming toward the $p^+$ impurity diffused region 53 from outside through the dielectric layer 46 and the waveguide layer 47. The passivation layer 45 stabilizes the characteristics of the opto-electric converting section 43. The passivation layer 45 is also provided on other areas (not shown) of the waveguide-photodetector 400 such as an IC which is liable to be contaminated.

The passivation layer 45 can also act as an anti-reflection layer in the coupling section 48 by optimizing the refractive index and the thickness thereof. The passivation layer 45 can be formed of silicon dioxide, silicon nitride, or polyimide.

In the fourth example, the passivation layer 45 is formed of silicon nitride in order to allow the opto-electric converting section 43 to be produced in parallel with ICs (not shown) for reducing the production cost. Furthermore, the passivation layer 45 has a thickness of about 96 nm when silicon nitride having a refractive index of about 2.0 is used in order to cause the passivation layer 45 to act also as an anti-reflection layer.

The passivation layer 45 is formed by low pressure CVD to increase the density of the particles thereof. A higher density of the particles blocks the contaminating substances more efficiently. Sputtering, which is generally used for layer formation, is not appropriate for forming the passivation layer 45 since the layer formation performed along re-sputtering damages the opto-electric converting section 43.

EXAMPLE 5

A waveguide-photodetector in a fifth example according to the present invention will be described with reference to FIG. 4.

In the fifth example, the dielectric layer of the waveguide-photodetector 100 in the first example is formed of a single PSG (phospho-silicate glass) layer or a single BPSG (boron-doped phospho-silicate glass) layer. The dielectric layer can be formed of a plurality of layers including a PSG layer or a BPSG layer. The dielectric layer can also be formed of a plurality of layers including an SOG (spin on glass) layer combined with a PSG layer or a BPSG layer. The stress generated in the dielectric layer having such a composition is sufficiently small to restrict generation of cracks and also to alleviate an adverse influence on the characteristics of the opto-electric converting section.

In a structure including a waveguide layer above a semiconductor substrate, a buffer layer formed of a dielectric material needs to be provided for separating the waveguide layer from the semiconductor substrate to prevent the semiconductor substrate from absorbing the light propagating through the waveguide layer. The dielectric layer needs to have a property of allowing the light propagated through the waveguide layer to transmit therethrough (light transmittance) and also needs to have a refractive index smaller than that of the waveguide layer.

Figure 4:
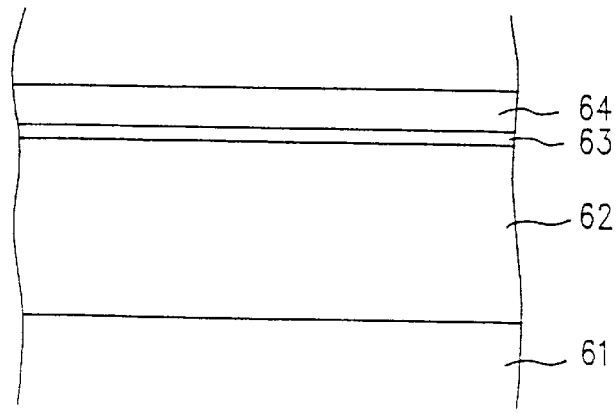
FIG. 4 is a partial cross-sectional view of a waveguide-photodetector in a fifth example according to the present invention.

As shown in FIG. 4, the waveguide-photodetector includes a Si substrate 61, a PSG or BPSG layer 62, and an SOG layer 63 provided sequentially in this order. An epitaxial layer is provided on the Si substrate 61 as in the first example but is omitted in FIG. 4. The PSG or BPSG layer 62 and the SOG layer 63 form a dielectric layer. A waveguide layer 64 is provided on the SOG layer 63. The SOG layer 63 is provided for reducing the propagation loss in the waveguide layer 64 by smoothing the dielectric layer when the PSG or BPSG layer 62 has an excessively large surface roughness due to the formation method thereof. The SOG layer 63 can be eliminated if the PSG or BPSG layer 62 has a sufficiently small surface roughness. An example of optimum conditions of the waveguide layer 64 and the dielectric layer is as follows:

Waveguide layer 64
  Glass layer
  Refractive index: about 1.53
  Thickness: about 600 nm
Dielectric layer
  SOG layer 63
  Refractive index: about 1.43
  Thickness: about 200 nm
  PSG (BPSG) layer 62
  Refractive index: about 1.44
  Thickness: about 4 $\mu$m The stress generated in the dielectric layer including the PSG or BPSG layer 62 is sufficiently small to restrict the generation of cracks and also to alleviate an adverse influence on the characteristics of the waveguide section, even though the PSG or BPSG layer 62 is as thick as 4 $\mu$m.

The waveguide-photodetector in the fifth example is described as a modification of the waveguide-photodetector 100 in the first example, but the dielectric layer in the second and third examples can have such a composition. In such cases also, the generation of cracks can be restricted, and an adverse influence on the opto-electric converting section can be alleviated.

EXAMPLE 6

A waveguide-photodetector in a sixth example according to the present invention will be described with reference to FIG. 5.

In the sixth example, the dielectric layer of the waveguide-photodetector 100 in the first example is formed of a plurality of layers including an NSG (non-doped silicate glass) layer. The plurality of layers can include an SOG layer as well as an NSG layer.

NSG, which includes non-doped material, is more suitable as an optical material than PSG or BPSG. However, the stress generated in an NSG layer is relatively large. Consequently, when the dielectric layer is formed of a single NSG layer having a thickness of 4 $\mu$m or more, cracks may be generated or the characteristics of the waveguide section may be changed. Accordingly, NSG needs to be used in combination with another material.

Figure 5:
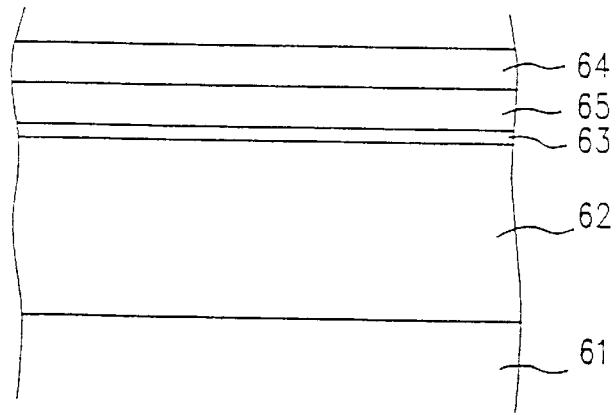
FIG. 5 is a partial cross-sectional view of a waveguide-photodetector in a sixth example according to the present invention.

As shown in FIG. 5, the waveguide-photodetector includes a Si substrate 61, a PSG or BPSG layer 62, an SOG layer 63, and an NSG layer 65 provided sequentially in this order. The PSG or BPSG layer 62, the SOG layer 63, and the NSG layer 65 form a dielectric layer. A waveguide layer 64 is provided on the NSG layer 65. The PSG or BPSG layer 62 is provided for alleviating the stress in the NSG layer. The SOG layer 63 is provided for reducing the propagation loss in the waveguide layer 64 by smoothing the dielectric layer when the PSG or BPSG layer 62 has an excessively large surface roughness due to the formation method thereof. The SOG layer 63 can be eliminated if the PSG or BPSG layer 62 has a sufficiently small surface roughness. An example of optimum conditions of the waveguide layer 64 and the dielectric layer is as follows:

Waveguide layer 64
  Glass layer
  Refractive index: about 1.53
  Thickness: about 600 nm
Dielectric layer
  NSG layer 65
  Refractive index: about 1.43
  Thickness: about 500 nm
  SOG layer 63
  Refractive index: about 1.43
  Thickness: about 200 nm
  PSG (BPSG) layer 62
  Refractive index: about 1.44
  Thickness: about 3.5 $\mu$m The dielectric layer including the NSG layer 65 used in combination with, for example, the PSG or BPSG layer 62 restricts the generation of cracks and also alleviates an adverse influence on the characteristics of the opto-electric converting section even though the total thickness of the NSG layer 65 and the PSG or BPSG layer 62 is as great as 4 $\mu$m.

EXAMPLE 7

A waveguide-photodetector 700 in a seventh example according to the present invention will be described with reference to FIG. 6.

Figure 6:
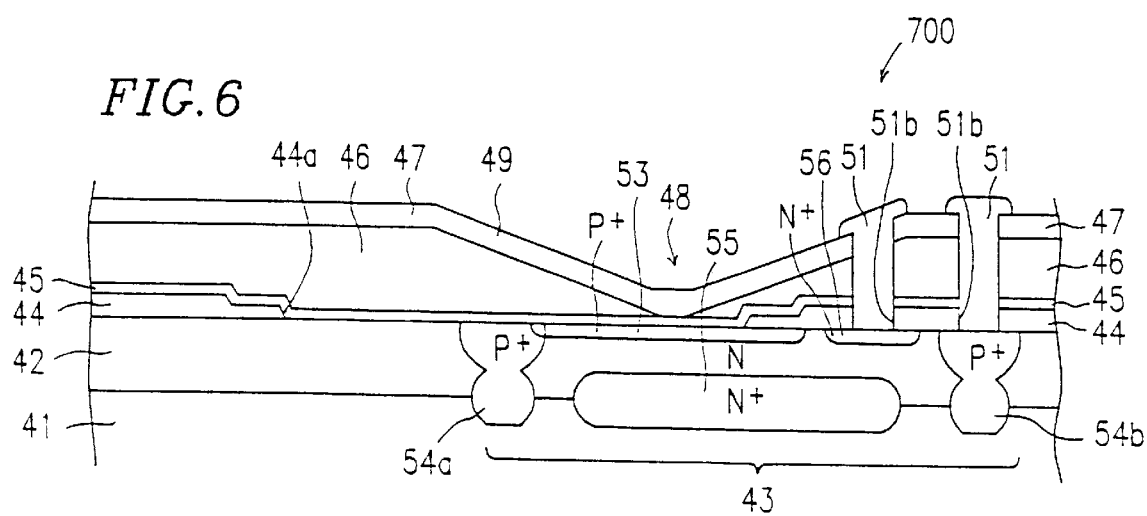
FIG. 6 is a cross-sectional view of a waveguide-photodetector in a seventh example according to the present invention.

FIG. 6 is a cross-sectional view of the waveguide-photodetector 700. The waveguide-photodetector 700 is different from the waveguide-photodetector 400 in the fourth example in that electrodes 51 for sending an electric signal from an opto-electric converting section 43 to an IC or the like are formed after the dielectric layer 46 and a waveguide layer 47 are formed. Identical elements previously discussed with respect to FIG. 3 will bear identical reference numerals therewith and the descriptions thereof will be omitted.

The waveguide-photodetector 700 is produced in the following manner.

The n-type Si epitaxial layer 42, the SiO$_2$ layer 44, and the passivation layer 45 are formed on the p-type Si substrate 41 in the same manner as in the fourth example. The p$^+$ impurity diffused region 54a and the n$^+$ impurity diffused region 55 are also formed in the same manner as in the fourth example.

Then, the dielectric layer 46 and the waveguide layer 47 are formed on the passivation layer 45. Openings are not formed at this stage. In the coupling section 48 of the waveguide section, the dielectric layer 46 is tapered from two directions so as to become thinner approaching the coupling section 48. The waveguide layer 47 has parts 49 inclining in accordance with the tapered parts of the dielectric layer 46. Since the dielectric layer 46 is tapered from two directions of the coupling section 48, the waveguide layer 47 has a V-shaped cross section as shown in FIG. 6. At the bottom of the V-shaped waveguide layer 47, the dielectric layer 46 is not provided. In this area, the waveguide layer 47 is separated from the p$^+$ impurity diffused region 53 only by the passivation layer 45.

Next, on the side of the coupling section 48 of the waveguide section opposite the light-incident side, openings 51b are formed through the waveguide layer 47, the dielectric layer 46, the passivation layer 45, and the SiO$_2$ layer 44 until reaching the n-type Si epitaxial layer 42. After that, electrodes 51 for sending an electric signal from the opto-electric converting section 43 to an IC or the like are formed so as to cover the openings 51b. Thus, the electrodes 51 are put into contact with the p$^+$ impurity diffused region 54b and the n$^+$ impurity 56, which are provided in the n-type epitaxial layer 42.

By forming the dielectric layer 46 and the waveguide layer 47 before the electrodes 51, the electrodes 51 are prevented from being adversely influenced by annealing, which is performed to reduce the propagation loss in the waveguide layer 47.

The electrodes 51 are formed, for example, in the following manner.

After the waveguide layer 47 is formed or after the waveguide layer 47 is annealed, a photoresist is formed on the waveguide layer 47 and patterned. Then, the openings 51b are formed by wet etching. Use of an etchant containing hydrogen fluoride allows the etching to be stopped when the openings 51b reach a surface of the n-type Si epitaxial layer 42. Next, a material for the electrodes 51 (for example, aluminum) is deposited on the waveguide layer 47 so as to cover the openings 51b and patterned by lift-off. Alternatively, the material for the electrodes 51 is deposited on the entire surface of the waveguide layer 47 and unnecessary areas are removed by etching. Thus, the electrodes 51 are formed.

When necessary, annealing is performed in order to secure the contact of the electrodes 51 with n$^+$ impurity diffused region 56 and the p$^+$ impurity diffused region 54b in the n-type epitaxial layer 42. The annealing may cause metal ions to be diffused from the electrodes 51 to the waveguide layer 47, thereby increasing the propagation loss in the waveguide layer 47. However, the electrodes 51 are formed on the side opposite the light-incident side of the coupling section 48 of the waveguide section. Due to such a structure, the light propagated toward the coupling section 48 of the waveguide section is almost entirely coupled to the opto-electric converting section 43 and is not propagated through the waveguide layer 47 in the vicinity of the electrodes 51. Accordingly, the increase in propagation loss in this area of the waveguide layer 47 has no influence on the performance of the opto-electric converting section 43.

After the formation of the electrodes 51 or the annealing performed thereafter, an anti-oxidation layer (not shown) for protecting the electrodes 51 against oxidation is formed so as to cover the electrodes 51. The anti-oxidation layer is formed of, for example, polyimide.

EXAMPLE 8

A waveguide-photodetector 800 in an eighth example according to the present invention will be described with reference to FIG. 7.

Figure 7:
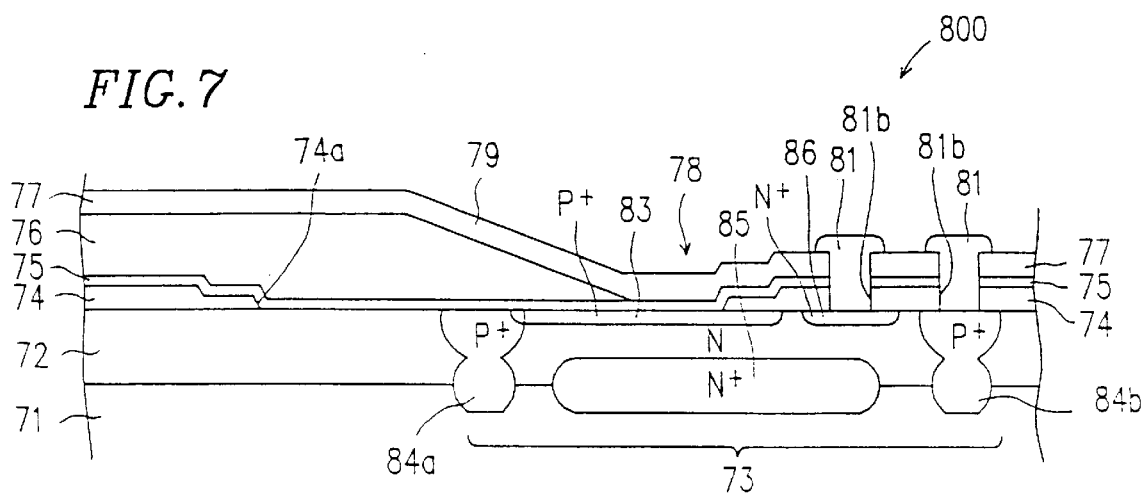
FIG. 7 is a cross-sectional view of a waveguide-photodetector in an eighth example according to the present invention.

FIG. 7 is a cross-sectional view of the waveguide-photodetector 800. The waveguide-photodetector 800 is different from the waveguide-photodetector 700 in the seventh example in that a dielectric layer 76 acting as a buffer layer is provided only on the light-incident side of a coupling section 78 of the waveguide section, and thus a waveguide layer 77 has a part 79 inclining only in one direction.

The waveguide-photodetector 800 is produced in the following manner.

On a p-type Si substrate 71, a part of a p$^+$ impurity diffused region 84a, a part of a p$^+$ impurity diffused region 84b, and an n$^+$ impurity diffused region 85 are formed. Then, an n-type Si epitaxial layer 72 is grown on the p-type Si substrate 71. A surface area of the n-type Si epitaxial layer 72 is thermally oxidized to form the SiO$_2$ layer 74 thereon. The SiO$_2$ layer 74 is etched into a prescribed pattern to form an opening on the n-type epitaxial layer 72. The resultant layers are kept in a high-temperature atmosphere including impurities to diffuse the impurities through the opening using the SiO$_2$ layer 74 as a mask. Thus, the remaining part of the p$^+$ impurity diffused region 84a, the remaining part of the p$^+$ impurity diffused region 84b, and an n$^+$ impurity diffused region 86 are formed. The SiO$_2$ layer 74 is once removed, and the same steps are repeated. Thus, a p$^+$ impurity diffused region 83 is formed in the n-type Si epitaxial layer 72. The size and position of the p$^+$ impurity diffused region 83 are defined by the opening formed in the SiO$_2$ layer 74.

Next, a passivation layer 75 is formed on the SiO$_2$ layer 74 and the p$^+$ impurity diffused region 83 when necessary. Then, the dielectric layer 76 is formed on the passivation layer 75. A part of the dielectric layer 76 which is on the side of the coupling section 78 opposite the light-incident side is removed. The removal can be conducted by forming a photoresist and performing wet etching with an etchant containing hydrogen fluoride. Before the formation of the dielectric layer 76, a layer of a different material can be deposited on an area of the passivation layer 75 corresponding to the part of the dielectric layer 76 to be removed. Such a layer can be used as an etching stop layer for facilitating the wet etching performed after the formation of the dielectric layer 76. Then, the waveguide layer 77 is formed on the passivation layer 75 so as to cover the dielectric layer 76.

Then, on the side of the coupling section 78 of the waveguide section opposite the light-incident side, openings 81b are formed through the waveguide layer 77, the passivation layer 75, and the SiO$_2$ layer 74 until reaching the n-type Si epitaxial layer 72. After that, electrodes 81 for sending an electric signal from the opto-electric converting section 73 to an IC or the like are formed so as to cover the openings 81b. Thus, the electrodes 81 are put into contact with the p$^+$ impurity diffused region 84b and the n$^+$ impurity diffused region 86, which are provided in the n-type epitaxial layer 72.

By forming the dielectric layer 76 and the waveguide layer 77 before the electrodes 81, the electrodes 81 are prevented from being adversely influenced by annealing which is performed for reducing the propagation loss in the waveguide layer 77.

The electrodes 81 are formed, for example, in the same manner as described in the seventh example. Specifically, after the waveguide layer 77 is formed or after the waveguide layer 77 is annealed, a photoresist is formed on the waveguide layer 77 and patterned. Then, the openings 81b are formed by wet etching. Use of an etchant containing hydrogen fluoride allows the etching to be stopped when the openings 81b reach a surface of the n-type Si epitaxial layer 72. Next, a material for the electrodes 81 (for example, aluminum) is deposited on the waveguide layer 77 so as to cover the openings 81b and patterned by lift-off. Thus, the electrodes 81 are formed. Alternatively, the material for the electrodes 81 is deposited on the entire surface of the waveguide layer 77 and unnecessary areas are removed by etching. Since the dielectric layer 76 is removed in the area where the openings 81b are formed, the depth of the openings 81b can be reduced and thus the openings 81b can be formed and positioned more easily.

When necessary, annealing is performed in order to secure the contact of the electrodes 81 with the $n^+$ impurity diffused region 86 and the $p^+$ impurity diffused region 84b in the n-type epitaxial layer 72. The annealing may cause metal ions to be diffused from the electrodes 81 to the waveguide layer 77, thereby increasing the propagation loss in the waveguide layer 77. However, the electrodes 81 are formed on the side opposite the light-incident side of the coupling section 78 of the waveguide section. Due to such a structure, the light propagated toward the coupling section 78 is almost entirely coupled to the opto-electric converting section 73 and is not propagated through the waveguide layer 77 in the vicinity of the electrodes 81. Accordingly, the increase in propagation loss in this area of the waveguide layer 77 has no influence on the performance of the opto-electric converting section 73.

After the formation of the electrodes 81 or the annealing performed thereafter, an anti-oxidation layer (not shown) for protecting the electrodes 81 against oxidation is formed so as to cover the electrodes 81. The anti-oxidation layer is formed of, for example, polyimide.

EXAMPLE 9

A waveguide-photodetector 900 in a ninth example according to the present invention will be described with reference to FIG. 8.

Figure 8:
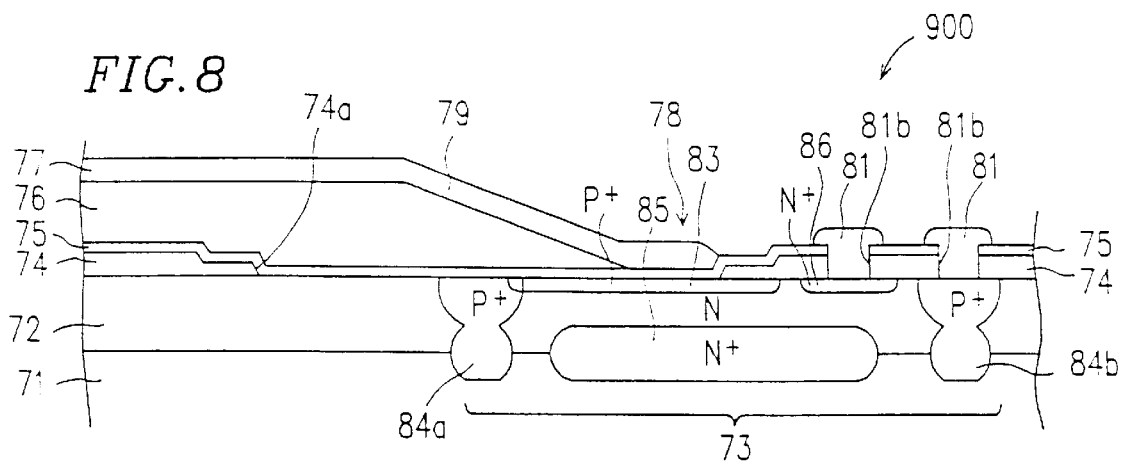
FIG. 8 is a cross-sectional view of a waveguide-photodetector in a ninth example according to the present invention.

FIG. 8 is a cross-sectional view of the waveguide-photodetector 900. The waveguide-photodetector 900 is different from the waveguide-photodetector 800 in the eighth example in that a waveguide layer 77, in addition to the dielectric layer 76, is provided only on the light-incident side of a coupling section 73 of the waveguide section. Identical elements previously discussed with respect to FIG. 7 will bear identical reference numerals therewith and the descriptions thereof will be omitted.

The waveguide-photodetector 900 is formed in the same manner as in the eighth example. Until the formation of the passivation layer 75, the formation is performed in the same manner as described in the eighth example.

After the passivation layer 75 is formed, the dielectric layer 76 and a waveguide layer 77 are formed sequentially.

A part of the dielectric layer 76 and a part of the waveguide layer 77 which are on the side of the coupling section 78 opposite the light-incident side are removed in the same manner as described in the eighth example, namely, by forming a photoresist and performing wet etching with an etchant containing hydrogen fluoride. The dielectric layer 76 and the waveguide layer 77 can be removed in one step. In an alternative method, the dielectric layer 76 is formed and patterned, and then the waveguide layer 77 is formed and patterned. In the latter case, a layer of a different material can be deposited on an area of the passivation layer 75 corresponding to the part of the waveguide layer 77 to be removed. Such a layer can be used as an etching stop layer for facilitating the wet etching performed after the waveguide layer 77 is formed.

Then, on the side of the coupling section 78 opposite the light-incident side, openings 81b are formed through the passivation layer 75 and the $SiO_2$ layer 74 until reaching the n-type Si epitaxial layer 72. After that, electrodes 81 for sending an electric signal from the opto-electric converting section 73 to an IC or the like are formed so as to cover the openings 81b. Thus, the electrodes 81 are put into contact with the $p^+$ impurity diffused region 84b and the $n^+$ impurity diffused region 86, which are provided in the n-type epitaxial layer 72.

By forming the dielectric layer 76 and the waveguide layer 77 before the electrodes 81, the electrodes 81 are prevented from being adversely influenced by annealing which is performed for reducing the propagation loss in the waveguide layer 77.

The electrodes 81 can be formed in the same manner as described in the eighth example. Since the dielectric layer 76 and the waveguide layer 77 are removed in the area where the openings 81b are formed, the depth of the openings 81b can be reduced and thus the openings 81b can be positioned and formed more easily than in the eighth example.

In the first through ninth examples, a waveguide layer is provided above an area of a semiconductor substrate enclosed by a step portion formed in the insulative layer formed of $SiO_2$ or the like. The waveguide layer is provided above the enclosed area with a buffer layer therebetween, the buffer layer being formed of a buffer layer formed of PSG, BPSG, NSG, SOG, etc. The size and position of the impurity diffused region are defined by the area enclosed by a step portion in the insulative layer, namely, the opening in the insulative layer. A part of the impurity diffused region acts as a part of the light receiving section of the opto-electric converting section. A passivation layer formed of, for example, silicon nitride by CVD is provided between a photodetecting section and an IC, and the buffer layer. The buffer layer and the waveguide layer are not provided in the vicinity of electrodes. As can be appreciated from the above description, the area for substantially propagating light, namely, the introducing section, the propagation section, and the coupling section of the waveguide section, are all provided above the area enclosed by the step portion. Accordingly, it is not necessary to, before the formation of the waveguide section, flatten the area where the waveguide section is to be formed. Furthermore, the buffer layer and the coupling section can be designed and formed more easily. Accordingly, the structure of the conventional high-efficiency waveguide-photodetector can be adapted to a photodetector designed for faster response and higher integration. Thus, a high-performance waveguide-photodetector having stable characteristics can be obtained.

The passivation layer and the buffer layer can be formed of materials which stabilize the characteristics of the waveguide section. The waveguide layer can be annealed to raise the performance of the waveguide section without spoiling the electrodes. The electrodes can be formed by a method which reduces the production cost.

As described above, the impurity diffused region acting as a part of the receiving section is covered with a passivation layer. In this manner, the opto-electric converting section provided in the semiconductor substrate is protected against contamination by the material of the waveguide layer and by external substances coming through the waveguide layer. The opto-electric converting section thus protected obtains more stable characteristics, and the production yield thereof is also improved. The waveguide-photodetector including such an opto-electric converting section is more reliable.

Moreover, a semiconductor device acting, for example, as a circuit for processing the electric signal obtained by the opto-electric converting section can be produced in parallel with the formation of the passivation layer, and the passivation layer can be formed of silicon nitride for improving the density thereof. In such a case, the opto-electric converting section is protected more reliably against contamination by substances from the material of the waveguide layer and external substances coming through the waveguide layer. The stability and production yield of the opto-electric converting section are thus improved, which enhances the reliability of the waveguide-photodetector.

A dielectric layer acting as a buffer layer can be formed of a PSG or BPSG layer, or a plurality of layers including the PSG or BPSG layer. Due to such a material, the stress generated in the dielectric layer is alleviated. Accordingly, the generation of cracks in an area where a plurality of layers are stacked is restricted, and also change in the characteristics of the waveguide section is alleviated. These advantages raise the production efficiency and production yield of the waveguide, and improves the reliability of the waveguide-photodetector.

The dielectric layer can be formed of a plurality of layers including an NSG layer, which also alleviates a stress generated in the dielectric layer. Accordingly, the generation of cracks and change in the characteristics of the waveguide section are restricted. NSG is effective in preventing light from being absorbed by doping elements in the impurity diffused region. Thus, the characteristics and performance of the waveguide-photodetector are improved.

The dielectric layer can be formed of a plurality of layers including an SOG layer, by which the surface of the dielectric layer can be smoothed. The smooth surface reduces propagation loss and thus improves the performance of the waveguide-photodetector.

The passivation layer can be formed by low pressure CVD, which minimizes the damage to the semiconductor substrate. Further, the passivation layer formed by this method has a sufficiently high density, which more effectively protects the semiconductor substrate against contamination by substances from the material of the waveguide layer and external substances coming through the waveguide layer. As a result, the stability and production yield of the opto-electric converting section are improved, which enhances the reliability of the waveguide-photodetector.

In the case where all the layers contributing to propagation of light including an upper cladding layer are formed before the electrodes, the waveguide layer can be annealed to reduce the propagation loss therein before the formation of the electrodes. In such case, the electrodes are prevented from being spoiled by annealing.

The dielectric layer can be partially removed in an area which is not related to the light propagation and coupling. In this case, the electrodes are formed in this area where the dielectric is not provided. In this manner, the formation of openings through the layers is performed more easily. The production efficiency, production yield, and reliability of the waveguide-photodetector are improved.

EXAMPLE 10

Figure 9A:
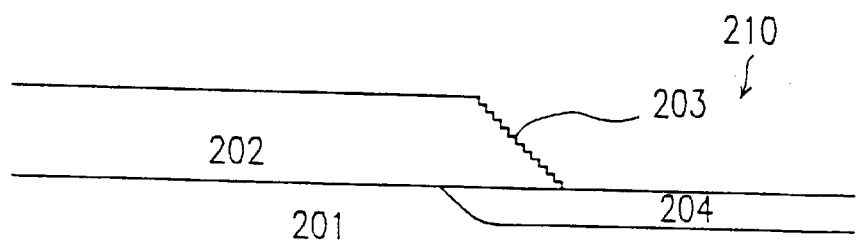
FIGS. 9A, 9B and 9C are cross-sectional views illustrating a method for producing a waveguide usable in a waveguide-photodetector in a tenth example according to the present invention.
Figure 9B:
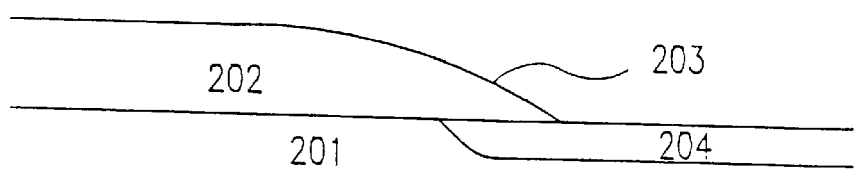
Figure 9C:
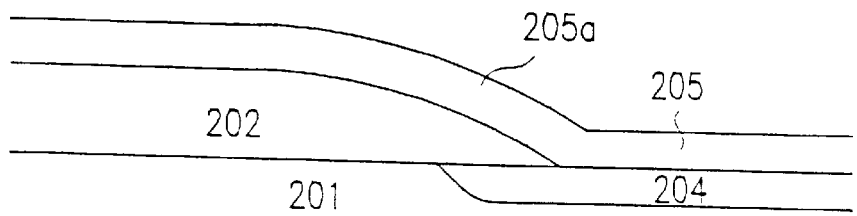

With reference to FIGS. 9A through 9C, a method for producing a waveguide 210 having a tapered end (tapered waveguide) in a tenth example according to the present invention will be described. The tapered waveguide 210 can be mounted on a semiconductor substrate integrally with a photodetecting section.

FIGS. 9A through 9C are cross-sectional views illustrating a method for producing the tapered waveguide 210.

As shown in FIG. 9A, an impurity diffused region 204 acting as a part of a light receiving section of a waveguide-photodetector is formed in a semiconductor substrate 201. Next, a dielectric layer 202 acting as a buffer layer is formed on the semiconductor substrate 201 and is patterned as prescribed, thereby forming a tapered part 203. The patterning can be performed by, for example, forming a photoresist having a prescribed pattern on the dielectric layer 202 and etching the dielectric layer 202 using the photoresist as a mask. The dielectric layer 202 can be formed of a light-transmitting material having a refractive index smaller than that of a waveguide layer 205 to be formed thereon. In the tenth example, a PSG layer is formed to a thickness of about 4 μm by atmospheric pressure CVD as the dielectric layer 202.

If the dielectric layer 202 has a thickness in a certain range or is produced by a certain method, a surface of the dielectric layer 202 may have a surface roughness which is sufficiently large to have an adverse influence on the propagation loss in the waveguide layer 205. Specifically, the tapered part 203 formed by etching tends to have a surface roughness larger than that of the rest of the dielectric layer 202.

In order to avoid an adverse influence and also in order to form the surface of the tapered part 203 to be slowly curved as shown in FIG. 9B, the surface of the tapered part 203 is polished.

Then, as shown in FIG. 9C, the waveguide layer 205 is formed on the dielectric layer 202 so as to have an inclining part 205a. The waveguide layer 205 is formed of a material having a refractive index higher than that of the dielectric layer 202. In the tenth example, the waveguide layer 205 is formed of #7059 glass (refractive index: 1.53; produced by Corning, Inc.) formed to a thickness of about 0.6 μm by RF sputtering. In this manner, the waveguide 210 having a slowly curved tapered part can be obtained.

The preferable conditions for polishing varies in accordance with the material of the dielectric layer 202 and the state in which the dielectric layer 202 is formed. An example of the preferable conditions are as follows:

Substrate: 4" silicon wafer
Dielectric layer: PSG (or BPSG); thickness: 4.2 μm
Polishing material: Diamond slurry;
  Diameter: 0.5 μm
Polishing cloth: Soft polishing cloth (produced by Maruto Instrument Co., Ltd.)

By polishing the surface of the dielectric layer 202 under, for example, these conditions, the surface of the tapered part 203 becomes slowly curved. Additionally, the surface of the flat part of the dielectric layer 202 is sufficiently smoothed.

In the tenth example, after the dielectric layer 202 is etched to have the tapered part 203, the tapered part 203 is polished. Accordingly, PSG or BPSG, which are not conventionally used for a buffer layer in a waveguide of a waveguide-photodetector due to its rough surface and high porosity, can now be used. The dielectric layer 202 formed of PSG or BPSG alleviates the stress generated therein. Thus, the generation of cracks can be restricted, and the characteristics of the waveguide 210 can be stabilized.

For polishing, a soft cloth such as a polishing cloth or a suede cloth can be used. By use of such a soft cloth, a tapered part having a desirable thickness and length can be formed.

Figure 10A:
FIGS. 10A and 10B show tapered parts in the waveguide shown in FIGS. 9A through 9C before and after polishing.
Figure 10B:
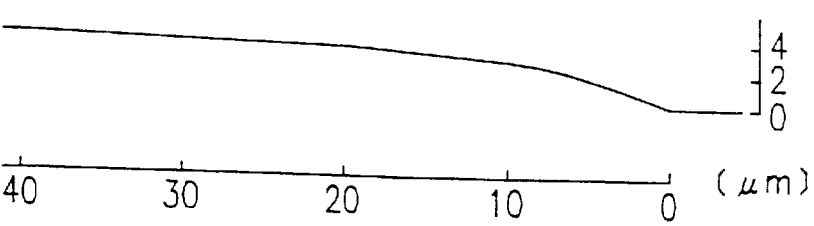

FIG. 10A shows an example of the tapered part 203 before polishing (FIG. 9A), and FIG. 10b shows an example of the tapered part 203 after polishing (FIG. 9B). The tapered part after polishing has a thickness of about 4 μm and a length of about 100 μm. The surface roughness of the tapered part, which is 80 nm before polishing is reduced to about 5 nm after polishing. Such a value is sufficiently small for the dielectric layer 202. The surface roughness of the tapered part after polishing is measured over the length of 200 μm from the tip thereof.

Referring to FIG. 9C again, the inclining part 205a of the waveguide layer 205 provided on such a slowly curved tapered part 203 is also slowly curved. Due to the smooth surface of the dielectric layer 202, the propagation loss in the waveguide layer 205 is sufficiently small, which improves the reliability of the waveguide 210.

In the waveguide-photodetector in the tenth example, an impurity diffused region 204 is adjacent to the end of the tapered part of the waveguide 210. Light propagated through the waveguide layer 205 is coupled to the light receiving section of the photodetecting section in the vicinity of the end of the tapered part. Then, the light is converted into an electric signal and is sent to an external signal processing device by an electrode.

As described above, the waveguide 210 in the tenth example includes a tapered waveguide and a photodetecting section integrally provided on one semiconductor substrate 201 (FIGS. 9C). In lieu of the semiconductor substrate 201, a dielectric substrate formed of a material having optical characteristics sufficient for a buffer layer or a composite of such materials, for example, quartz glass can be used. In such a case, a tapered waveguide for coupling two waveguides having different effective refractive indices can be produced.

Figure 11A:
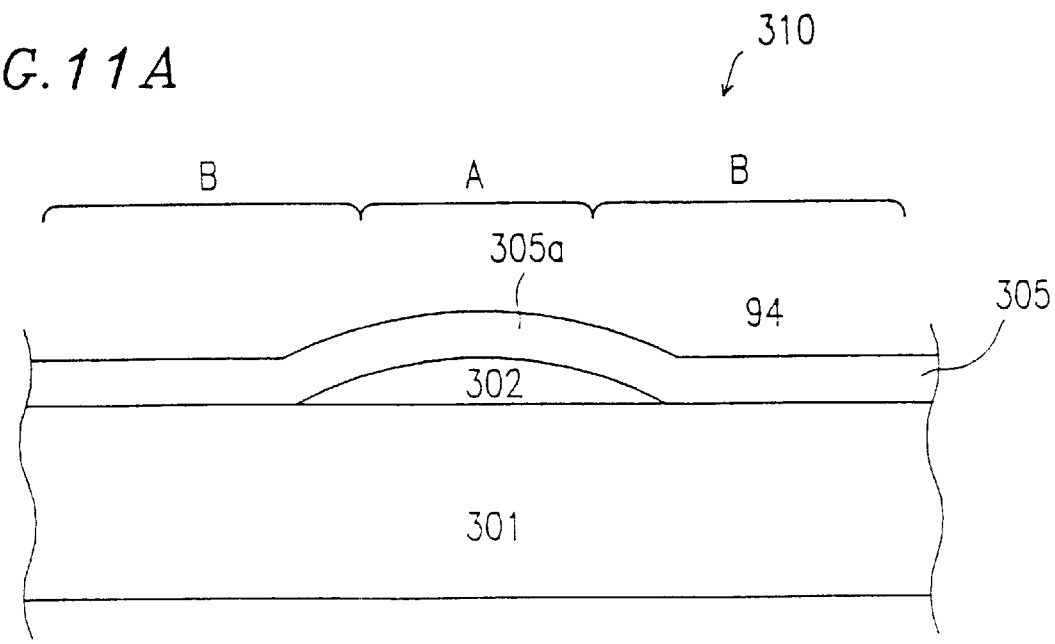
FIG. 11A is a partial cross-sectional view of a waveguide in an application of the tenth example according to the present invention.
Figure 11B:
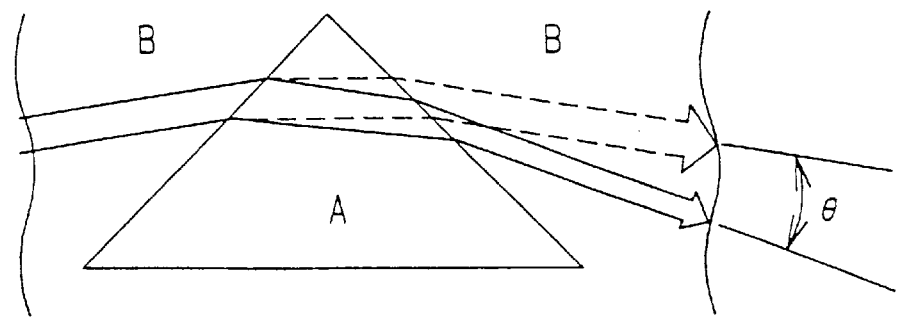
FIG. 11B show the principle of operation of the waveguide shown in FIG. 11A.

FIG. 11A is a schematic cross-sectional view of a refractive mode splitter using such a tapered waveguide 310. FIG. 11B shows the principle of mode separation in the refractive mode splitter shown in FIG. 11A.

The effective refractive index of a waveguide can be changed by the combination of the materials and the thicknesses of the layers included in the waveguide. In the mode splitter shown in FIGS. 11A and 11B, a waveguide layer 305 is provided on a dielectric substrate 301 to form an area B. A dielectric layer 302 having a refractive index larger than that of the dielectric substrate 301 is provided between the dielectric substrate 301 and the waveguide layer 305 to form an area A having an effective refractive index larger than that of the area B. The dielectric substrates 301 and 302 can be respectively formed of, for example, quartz glass and $TiO_2$.

As shown in FIG. 11B, the light propagated through the area B from left to right in FIG. 11B is refracted when passing through an interface between the areas B and A. At this point, light components in different modes are separated from each other and propagate in different directions by different refractive angles. In the same manner, the light components in different modes are refracted again when passing through another interface between the areas A and B. Thus, the light components in different modes go out of the tapered waveguide 310 at an angle θ with respect to each other.

In the mode splitter shown in FIG. 11A, light is propagated through the waveguide layer 305 having a slowly curved surface, which is provided on the dielectric layer 302 having a sufficiently smooth surface. Accordingly, the light can be propagated with no loss from a first area to a second area having a different refractive index from the first area.

By the method for producing a tapered waveguide in the tenth example, a tapered part is formed in the dielectric layer, and a surface of the dielectric layer is polished for the purpose of smoothing. Such polishing also causes the tapered part to be slowly curved. Accordingly, a separate step of causing the tapered part to be slowly curved is not required. Thus, the production yield is raised and the production cost is reduced.

Since the surface of the dielectric layer can be smoothed by polishing, even a porous layer having a large surface roughness formed by CVD or other method of deposition can be used for the dielectric layer. This enlarges the range of the materials usable for the dielectric layer, which is advantageous for integrating the waveguide with various devices. When the dielectric layer is formed of PSG or BPSG, the stress generated therein is alleviated. Thus, the generation of cracks in an area where a plurality of layers are stacked is restricted, and also change in the characteristics of the waveguide is alleviated. These advantages raise the production efficiency and production yield, and improves the reliability of the waveguide.

The sufficiently smooth surface of the dielectric layer reduces the propagation loss in the waveguide layer, which also improves the reliability of the waveguide.

EXAMPLE 11

Figure 12A:
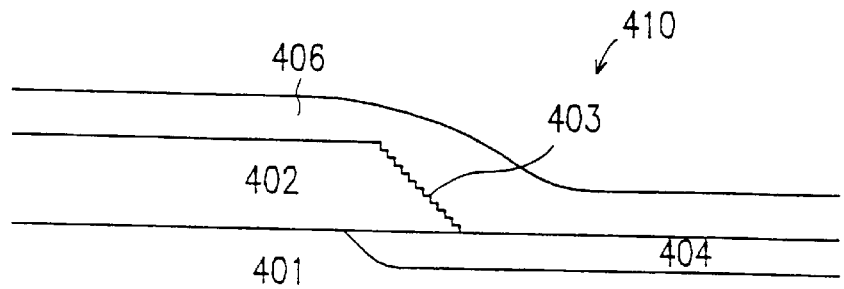
FIGS. 12A, 12B and 12C are cross-sectional views illustrating a method for producing a waveguide usable in a waveguide-photodetector in an eleventh example according to the present invention.
Figure 12B:
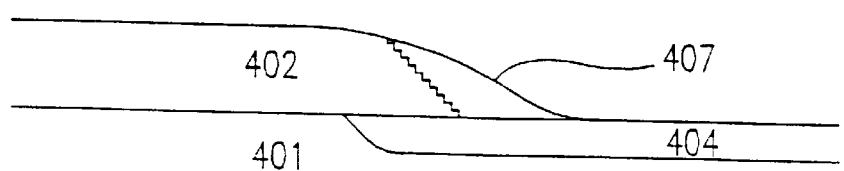
Figure 12C:
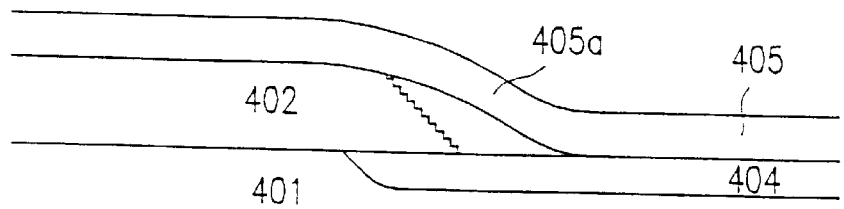

With reference to FIGS. 12A through 12C, a method for producing a tapered waveguide 410 in an eleventh example according to the present invention will be described. In the eleventh example also, the waveguide 410 is mounted on a semiconductor substrate integrally with a photodetecting section.

FIGS. 12A through 12C are cross-sectional views illustrating a method for producing the tapered waveguide 410.

As shown in FIG. 12A, an impurity diffused region 404 acting as a part of a light receiving section of a waveguide-photodetector is formed in a semiconductor substrate 401. Next, a dielectric layer 402 is formed on the semiconductor substrate 401 and is patterned as prescribed, thereby forming a tapered part 403. Then, the dielectric layer 402 and the substrate 401 are coated with an SOG layer 406. By providing the SOG layer 406 in this manner, the tapered part of the waveguide 410 can be slowly curved. The SOG layer 406 has optical characteristics appropriate for a buffer layer, and the dielectric layer 402 and the SOG layer 406 form a buffer layer. In the eleventh example, the dielectric layer 402 is formed of PSG to a thickness of about 4 μm, and the SOG layer 406 (OCD T-7 produced by Tokyo Ohka Kogyo Co., Ltd.) is formed to a thickness of 0.9 μm.

By forming a waveguide layer 405 on the SOG layer 406, a tapered waveguide can be obtained. However, if the waveguide formed in this manner is incorporated into a waveguide-photodetector integrally with a photodetecting section, the SOG layer 406 prevents coupling of the light propagated through the waveguide layer to the light detecting section.

In order to avoid such prevention, as shown in FIG. 12B, the SOG layer 406 is partially removed by polishing. Polishing is advantageous in that a surface 407 of the SOG layer 406 is not roughened. Since the polishing is performed with a soft cloth such as a polishing cloth or a suede cloth as in the tenth example, a tapered part having a desirable thickness and length can be formed. Thus, the tapered part is caused to have a slowly curved surface as shown in FIG. 12B. Then, as shown in FIG. 12C, a waveguide layer 405 is formed on the substrate 401 so as to cover the dielectric layer 402. The waveguide layer 405 can be formed of a light-transmitting material having a refractive index larger than that of the dielectric layer 402. In the eleventh example, the waveguide layer 405 is formed of #7059 glass (refractive index: 1.53; produced by Corning, Inc.) formed to a thickness of about 0.6 µm by RF sputtering. The waveguide layer 405 has a part 405a slowly inclining in accordance with the tapered part of the dielectric layer 402.

In this manner, the waveguide 401 having a slowly curved tapered part can be obtained.

In the waveguide-photodetector in the eleventh example, the impurity diffused region 404 is adjacent to the end of the tapered part of the waveguide 410. Light propagated through the waveguide layer 405 is coupled to the light receiving section of the photodetecting section in the vicinity of the end of the tapered part. Then, the light is converted into an electric signal and is sent to an external signal processing device by an electrode.

By the method in the eleventh example, after the tapered part is caused to be more slowly curved by providing an SOG layer 406, the tapered part is polished. Accordingly, the tip of the tapered part is more slowly curved than in the tenth example. Thus, the propagation loss in the waveguide layer 405 which is formed thereafter can be further reduced.

As described above, the waveguide-photodetector in the eleventh example includes a tapered waveguide and a photodetecting section integrally provided on one semiconductor substrate 401 (FIG. 12C). In lieu of the semiconductor substrate 401, a dielectric substrate formed of a material having optical characteristics sufficient for a buffer layer or a composite of such materials, for example, quartz glass can be used. In such a case, a tapered waveguide for coupling two waveguides having different effective refractive indices can be produced.

EXAMPLE 12

Figure 13A:
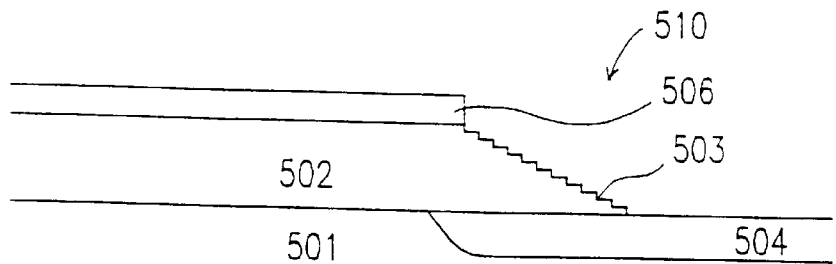
FIGS. 13A, 13B and 13C are cross-sectional views illustrating a method for producing a waveguide usable in a waveguide-photodetector in a twelfth example according to the present invention.
Figure 13B:
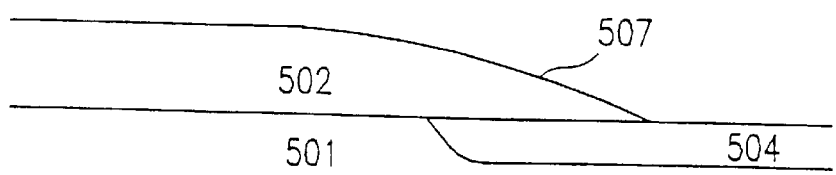
Figure 13C:
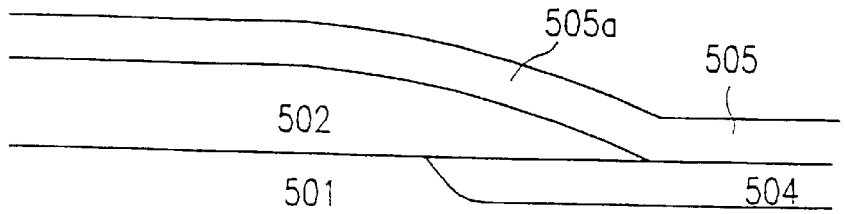

With reference to FIGS. 13A through 13C, a method for producing a tapered waveguide 510 in a twelfth example according to the present invention will be described. In the twelfth example also, the waveguide 510 is mounted on a semiconductor substrate integrally with a photodetecting section.

FIGS. 13A through 13C are cross-sectional views illustrating a method for producing the tapered waveguide 510.

As shown in FIG. 13A, an impurity diffused region 504 acting as a part of a light receiving section of a waveguide-photodetector is formed in a semiconductor substrate 501. Next, a dielectric layer 502 is formed on the semiconductor substrate 501. The dielectric layer 502 can be formed of a light-transmitting material having a refractive index smaller than that of a waveguide layer 505 to be formed thereon. Then, a layer 506 is formed on the dielectric layer 502. The layer 506 is formed by a material which can be etched by the same etchant with the dielectric layer 502 and has an etching rate higher than that of the dielectric layer 502. When the dielectric layer 502 is formed of any material having the above-mentioned properties, the layer 506 can be formed of, for example, SOG. A photoresist having a prescribed pattern is formed on the layer 506, and the dielectric layer 502 and the layer 506 are etched using the photoresist as a mask. Thus, a tapered part 503 of the dielectric layer 502 is formed.

The layer 506 partially remains on the dielectric layer 502. Such a remaining part is conventionally removed by performing wet etching in a short period of time. In the twelfth example, polishing is performed both to remove the remaining part and to cause the tapered part 503 of the dielectric layer 502 to be slowly curved as represented by reference numeral 507 shown in FIG. 13B. Since the polishing is performed with a soft cloth such as a polishing cloth or a suede cloth as in the twelfth example, a tapered part having a desirable thickness and length can be formed. Alternatively, the remaining part can be removed by wet etching, in which case the tapered part 503 is polished thereafter to form the slowly curved tapered part 507. However, wet etching is not preferable because (1) steps may be formed in the surface of the tapered part 507, (2) the dielectric layer 502 may be partially etched away to increase the surface roughness thereof, which requires to be polished to a greater degree, and (3) even the substrate 501 may be partially etched away.

After the slowly curved tapered part 507 is formed, as shown in FIG. 13C, the waveguide layer 505 is formed on the substrate 501 so as to cover the dielectric layer 502. The waveguide layer 505 has a part 505a slowly inclining in accordance with the tapered part 507 of the dielectric layer 502. The waveguide layer 505 can be formed of, for example, #7059 glass (refractive index: 1.53; produced by Corning, Inc.) formed to a thickness of about 0.6 µm by RF sputtering.

In this manner, the waveguide 510 having a slowly curved tapered part can be obtained.

In the waveguide-photodetector in the twelfth example, the impurity diffused region 504 is adjacent to the end of the tapered part of the waveguide 510. Light propagated through the waveguide layer 505 is coupled to the light receiving section of the photodetecting section in the vicinity of the end of the tapered part. Then, the light is converted into an electric signal and is sent to an external signal processing device by an electrode.

By the method in the twelfth example, a layer formed of a material having an etching rate higher than that of the dielectric layer is formed on the dielectric layer, and the two layers are etched to form a slowly curved tapered part. Polishing the surface of the resultant layer has two effects of (1) removing a part of the layer remaining after etching and (2) causing the tapered part to be slowly curved. Accordingly, a separate step for removing the layer is not necessary. In this manner, a waveguide having a smooth surface and a slowly curved tapered part can be obtained. The propagation loss in the waveguide layer in such a waveguide is negligible, and such a simpler process reduces the production cost.

Since the surface of the dielectric layer 502 can be smoothed by polishing, even a porous layer having a large surface roughness formed by CVD or other method of deposition can be used for the dielectric layer 502. This enlarges the range of the materials usable for the dielectric layer, which is advantageous for integrating the waveguide with various devices. When the dielectric layer is formed of PSG or BPSG, the stress generated therein is alleviated. Thus, the generation of cracks in an area where a plurality of layers are stacked is restricted, and also variations in the characteristics of the waveguide are alleviated. These advantages raise the production efficiency and production yield, and improves the reliability of the waveguide.

The sufficiently smooth surface of the dielectric layer 502 reduces the propagation loss in the waveguide layer, which also improves the reliability of the waveguide 510.

As described above, the waveguide-photodetector in the eleventh example includes a tapered waveguide and a photodetecting section integrally provided on one semiconductor substrate 501 (FIG. 13C). In lieu of the semiconductor substrate 501, a dielectric substrate formed of a material having optical characteristics sufficient for a buffer layer or a composite of such materials, for example, quartz glass can be used. In such a case, a tapered waveguide for coupling two waveguides having different effective refractive indices can be produced.

EXAMPLE 13

With reference to FIGS. 14A through 14D, a method for producing a tapered waveguide 610 in a thirteenth example according to the present invention will be described. In the thirteenth example also, the waveguide 610 is mounted on a semiconductor substrate integrally with a photodetecting section.

In the case where an opto-electric converting section is formed in a semiconductor substrate as in a waveguide-photodetector, etching or polishing performed for forming a slowly curved tapered part of the dielectric layer may damage the opto-electric converting section. In the thirteenth example, a passivation layer 608 is provided between a semiconductor substrate 601 and a dielectric layer 602 for protecting the semiconductor substrate 601 against etching and polishing.

FIGS. 14A through 14D are cross-sectional views illustrating a method for producing the tapered waveguide 610.

Figure 14A:
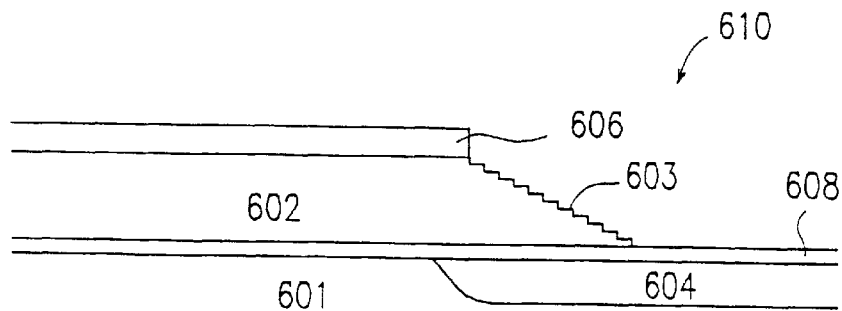
FIGS. 14A, 14B, 14C and 14D are cross-sectional views illustrating a method for producing a waveguide usable in a waveguide-photodetector in a thirteenth example according to the present invention.

As shown in FIG. 14A, an impurity diffused region 604 acting as a part of a light receiving section of a waveguide-photodetector is formed in the semiconductor substrate 601. Next, the passivation layer 608 is formed on the substrate 601, and the dielectric layer 602 is formed on the passivation layer 608. The dielectric layer 602 can be formed of a light-transmitting material having a refractive index smaller than a waveguide layer 605 to be formed thereon. In the thirteenth example, the dielectric layer 602 is formed to a thickness of about 4.2 $\mu$m since the tapered waveguide 610 needs to be about 3 $\mu$m high at the highest part. The passivation layer 608 needs to have an etching rate sufficiently lower than that of the dielectric layer 602 and also needs to be light-transmitting. When the dielectric layer 602 is formed of any material having the above-described properties, the passivation layer 608 can be formed of a silicon nitride layer formed by low pressure CVD, a plurality of layers including the silicon nitride layer, or a $SiO_2$ layer formed of CVD. In the thirteenth example, the passivation layer 608 is formed of a silicon nitride layer formed by low pressure CVD to a thickness of 96 nm.

Then, a layer 606 is formed on the dielectric layer 602. The layer 606 is formed by a material which can be etched by the same etchant with the dielectric layer 602 and has an etching rate higher than that of the dielectric layer 602. The layer 606 can be formed of, for example, SOG. In the thirteenth example, the layer 606 is formed of OCD T-2 (produced by Tokyo Ohka Kogyo Co., Ltd.) to a thickness of 0.15 $\mu$m. Then, the dielectric layer 602 and the layer 606 are subjected to wet etching using 10:1 BHF, thereby forming a tapered part 603 of the dielectric layer 602.

Since the etching rate of the passivation layer 608 is sufficiently lower than that of the dielectric layer 602, the substrate 601 is protected against the etchant.

Figure 14B:
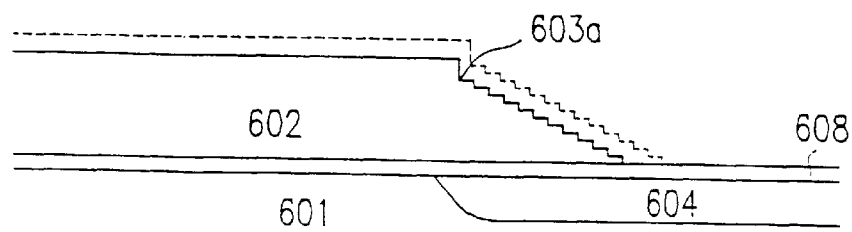

After the tapered part 603 is formed, the layer 606 partially remains on the dielectric layer 602. Such a remaining part is removed by performing wet etching in a short period of time. Even if wet etching is used for removing the remaining part, the substrate 601 is prevented by the passivation layer 608 from being etched. However, the dielectric layer 602 is also subjected to etching for the same period of time. As a result, as shown in FIG. 14B, a stepped surface area 603a of the tapered part 603 is generated.

In order to solve such an inconvenience, the surface of the dielectric layer 602 is polished. Thus, the tapered part 603 is caused to be slowly curved as indicated by reference numeral 607 in FIG. 14C. The passivation layer 608 also protects the substrate 601 against the polishing. Since the polishing is performed with a soft cloth such as a polishing cloth or a suede cloth as in the tenth example, a tapered part having a desirable thickness and length can be formed. Alternatively, the remaining part of the layer 606 can be removed together with the dielectric layer 602 when the dielectric layer 602 is polished as described in the twelfth example.

Figure 14C:
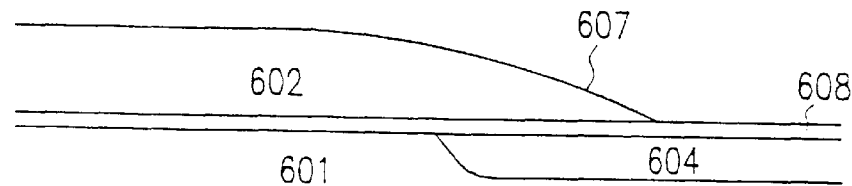
Figure 14D:
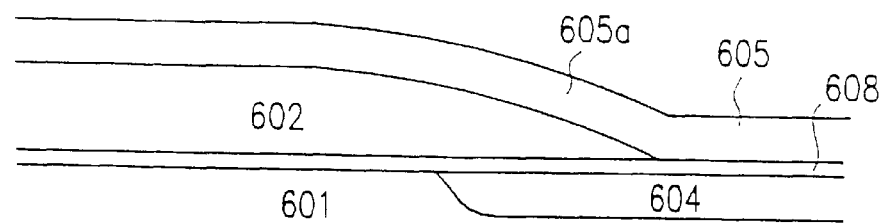
Figure 15:
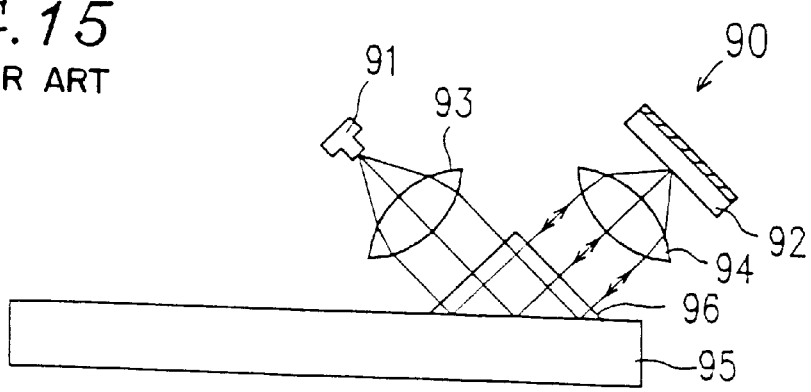
FIG. 15 is a schematic view of a conventional magneto-optical information recording and reproduction apparatus including a waveguide-photodetector.
Figure 16:
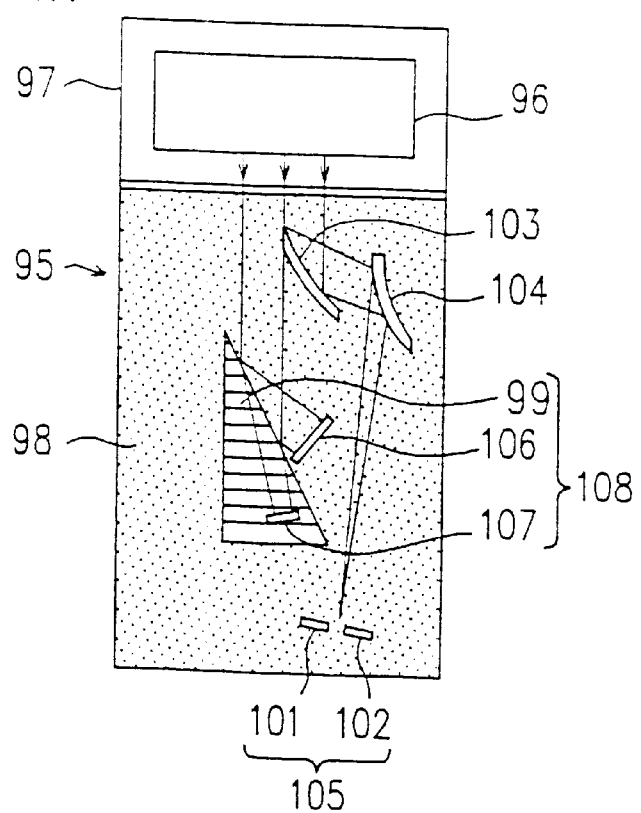
FIG. 16 is a plan view of the waveguide-photodetector shown in FIG. 15.
Figure 17A:
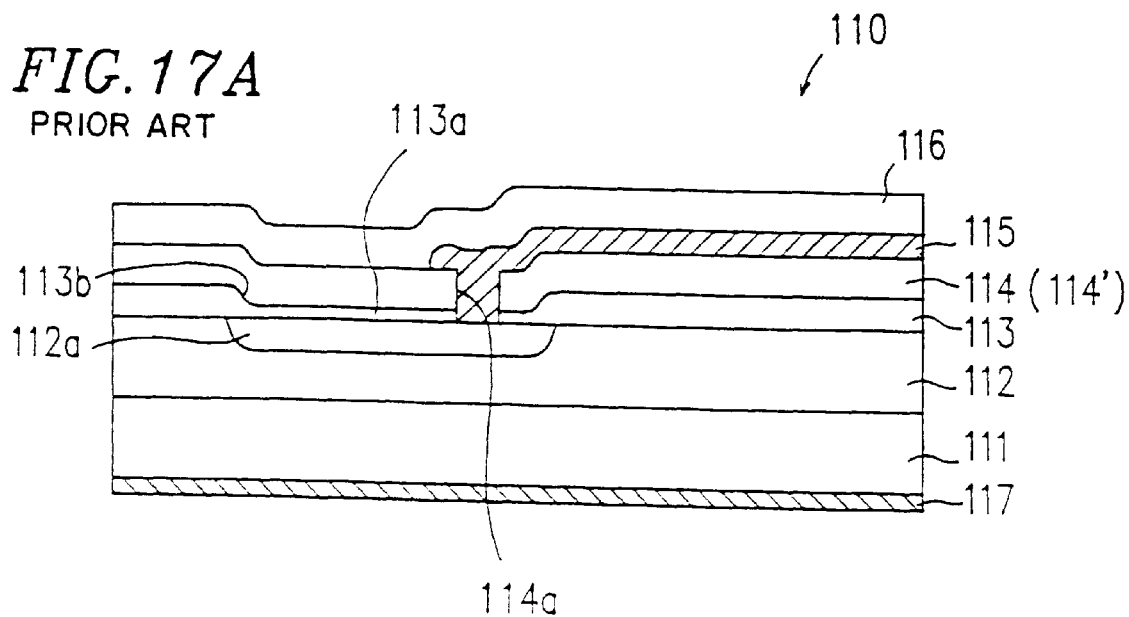
FIG. 17A is a cross-sectional view of a conventional waveguide-photodetector.
Figure 17B:
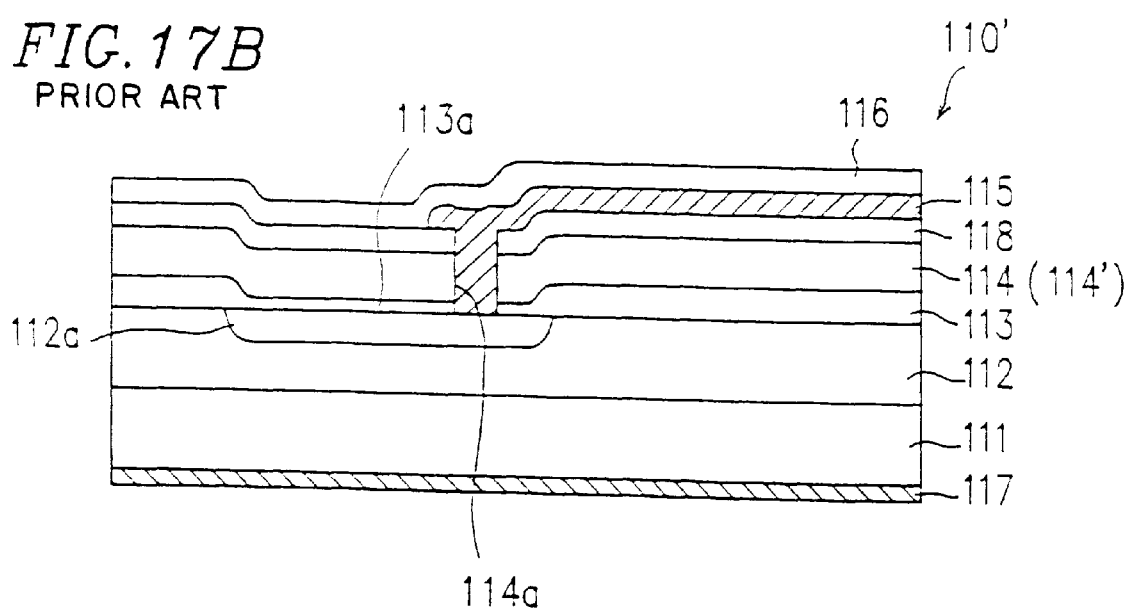
FIG. 17B is a cross-sectional view of another conventional waveguide-photodetector.
Figure 18A:
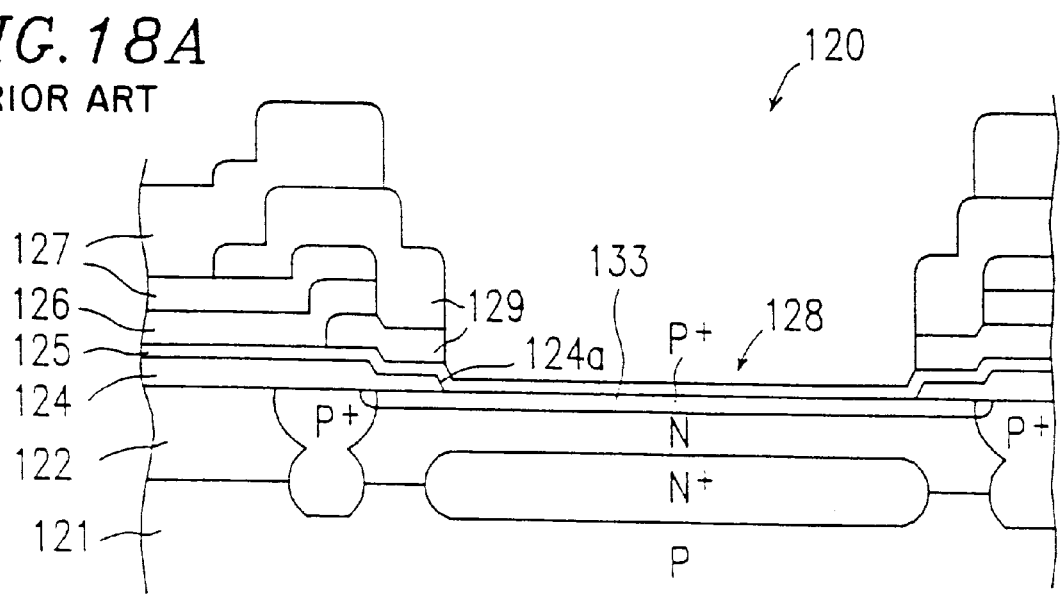
FIG. 18A is a cross-sectional view of a photodetector designed for a bulk-type optical system.
Figure 18B:
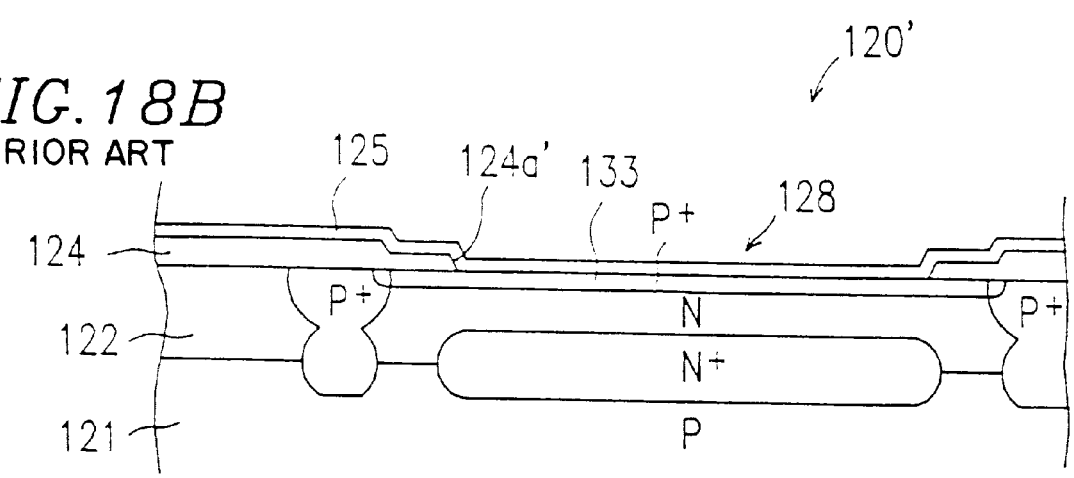
FIG. 18B is a cross-sectional view of a photodetector designed for a bulk-type optical system having a simpler structure than the photodetector shown in FIG. 18A.
Figure 19A:
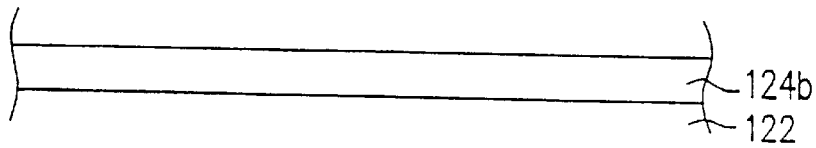
FIGS. 19A, 19B, 19C, 19D and 19E are cross-sectional views illustrating a method for producing the photodetector shown in FIG. 18A together with the reason why a step portion is unavoidably formed in the vicinity of a light receiving section in the photodetector shown in FIG. 18A.
Figure 19B:
Figure 19C:
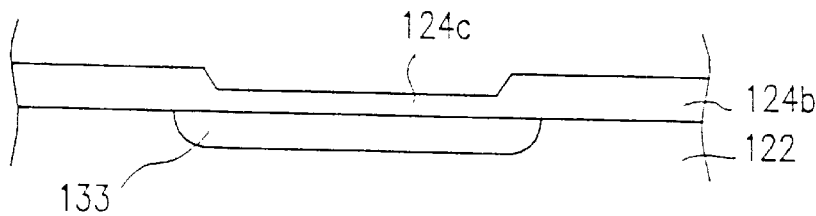
Figure 19D:
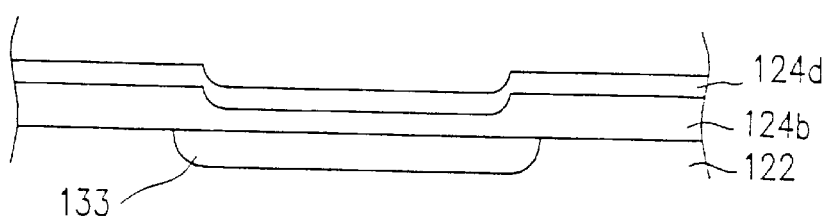
Figure 19E:
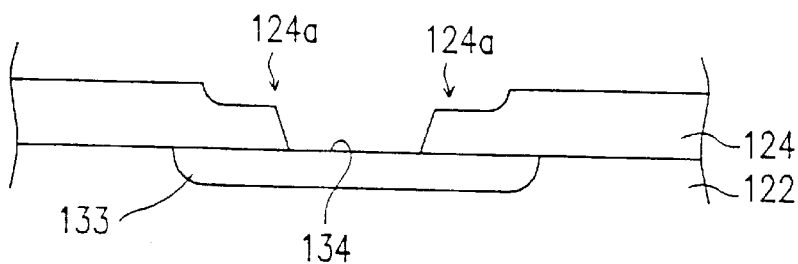
Figure 21A:
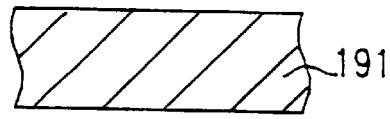
FIGS. 21A, 21B, 21C, 21D, 21E, 21F, 21G, 21H and 21I are cross-sectional views illustrating a conventional method for forming a waveguide having a tapered part by etching.
Figure 21B:
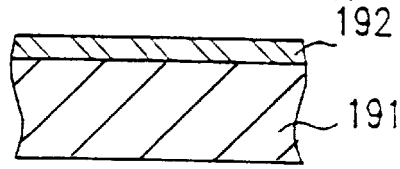
Figure 21C:
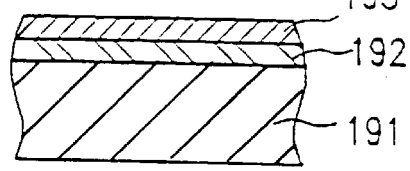
Figure 21D:
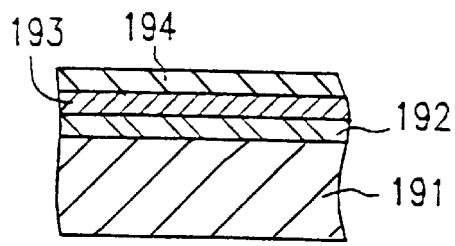
Figure 21E:
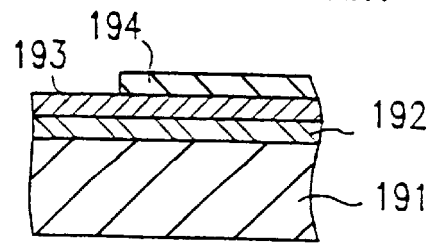
Figure 21F:
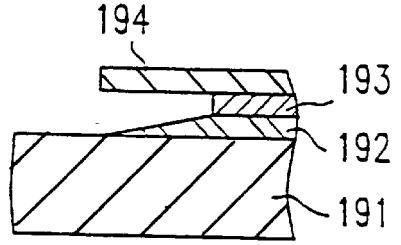
Figure 21G:
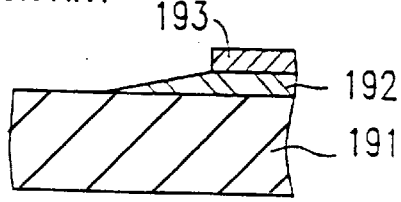
Figure 21H:
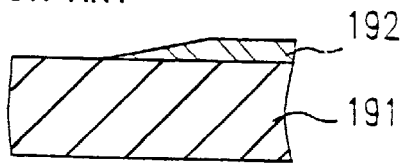
Figure 21I:
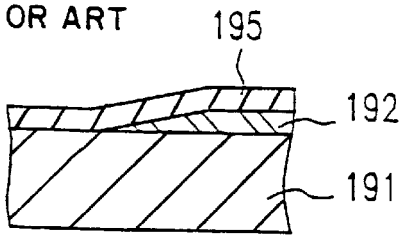

Then, as shown in FIG. 14D, the waveguide layer 605 is formed on the passivation layer 608 so as to cover the dielectric layer 602. The waveguide layer 605 has a part 605a slowly inclining in accordance with the tapered part 607 of the dielectric layer 602. The propagation loss in the waveguide layer 605 having such a shape is negligible. The waveguide layer 605 can be formed of a light-transmitting material having a refractive index larger than that of the dielectric layer 602. In this example, the waveguide layer 605 is formed of #7059 glass (refractive index: 1.53; produced by Corning, Inc.) formed to a thickness of about 0.6 $\mu$m by RF sputtering.

In this manner, the waveguide 610 having a slowly curved tapered part 605a can be obtained.

The passivation layer 608 is polished twice, namely, after the dielectric layer 602 is etched and after the layer 606 is etched. Accordingly, the passivation layer 608 needs to be sufficiently thick to avoid being removed by being polished twice. The required thickness depends on the material and the state in which the dielectric layer 602 is formed. For example, the thickness of the passivation layer 608 is about 0.5 $\mu$m.

In the waveguide-photodetector in the thirteenth example, the impurity diffused region 604 is adjacent to the end of the tapered part of the waveguide 610. Light propagated through the waveguide layer 605 is coupled to the light receiving section of the photodetecting section in the vicinity of the end of the tapered part. Then, the light is converted into an electric signal and is sent to an external signal processing device by an electrode.

By the method in the thirteenth example, a passivation layer 608 is provided between the semiconductor substrate 601 and the dielectric layer 602 to protect the semiconductor substrate 601 against etching and polishing. Thus, the performance of the waveguide 610 is improved.

Since the surface of the dielectric layer 602 can be smoothed by polishing, even a porous layer having a large surface roughness formed by CVD or other method of deposition can be used for the dielectric layer 602. This enlarges the range of the materials usable for the dielectric layer, which is advantageous for integrating the waveguide with various devices. When the dielectric layer is formed of PSG or BPSG, the stress generated therein is alleviated. Thus, the generation of cracks in an area where a plurality of layers are stacked is restricted, and also variations in the characteristics of the waveguide are minimized. These advantages raise the production efficiency and production yield, and improves the reliability of the waveguide.

The sufficiently smooth surface of the dielectric layer 602 reduces the propagation loss in the waveguide layer, which also improves the reliability of the waveguide 610.

As described above, the waveguide-photodetector in the eleventh example includes a tapered waveguide and a photodetecting section integrally provided on one semiconductor substrate 601 (FIG. 14C). In lieu of the semiconductor substrate 601, a dielectric substrate formed of a material having optical characteristics sufficient for a buffer layer or a composite of such materials, for example, quartz glass can be used. In such a case, a tapered waveguide for coupling two waveguides having different effective refractive indices can be produced.

In this case, if the semiconductor substrate 601 is resistant against the etchant used for etching the dielectric layer 602 and the layer 606, the passivation layer 608 can be eliminated. The passivation layer 608 needs to have optical characteristics appropriate for a buffer layer. An exemplary suitable material for the passivation layer 608, which has such optical characteristics and is usable in a semiconductor process is $SiO_2$ deposited by CVD (annealing may be necessary). A plurality of layers including a $SiO_2$ layer can also be suitable.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A waveguide-photodetector, comprising:

a semiconductor substrate;

a waveguide section, provided on the semiconductor substrate, for propagating light;

an opto-electric converting section, provided in the semiconductor substrate, for converting the light into an electric signal; and an insulative layer provided between the semiconductor substrate and the waveguide section, wherein the waveguide section includes at least an introducing part for introducing the light to the waveguide section, a coupling part for coupling the light introduced to the waveguide section to the opto-electric converting section, and a propagating part for propagating the light from the introducing part to the coupling part, the insulative layer includes a first region for defining a position and a shape of an impurity diffused region of the opto-electric converting section, wherein the insulative layer further includes a second region which encloses the first region and is thicker than the first region, and a step portion between the first region and the second region, the propagating part is formed on a smooth surface of at least one layer covering the first region and the second region, and the introducing part, the propagating part and the coupling part of the waveguide section are located on the first region.

2. A waveguide-photodetector according to claim 1, wherein the first region of the insulative layer is an opening.

3. A waveguide-photodetector according to claim 2, further comprising a passivation layer, provided at least between the coupling part of the waveguide section and the opto-electric converting section, for protecting the semiconductor substrate.

4. A waveguide-photodetector according to claim 3, wherein the passivation layer is formed of silicon nitride.

5. A waveguide-photodetector according to claim 1, wherein the waveguide section includes a dielectric layer provided on the insulative layer and a waveguide layer provided on the dielectric layer, and the dielectric layer includes at least one of a PSG layer and a BPSG layer.

6. A waveguide-photodetector according to claim 5, wherein the dielectric layer further includes an NSG layer.

7. A waveguide-photodetector according to claim 6, wherein the dielectric layer further includes an SOG layer.

8. A waveguide-photodetector according to claim 1, wherein the waveguide section includes a dielectric layer provided on the insulative layer and a waveguide layer provided on the dielectric layer, and the dielectric layer includes a lamination of a plurality of layers including an NSG layer.

9. A waveguide-photodetector according to claim 8, wherein the dielectric layer further includes an SOG layer.

10. A waveguide-photodetector according to claim 1, wherein the waveguide section includes a dielectric layer provided on the insulative layer and a waveguide layer provided on the dielectric layer, and the dielectric layer includes a lamination of a plurality of layers including an SOG layer.

11. A waveguide for a waveguide-photodetector including a dielectric layer having an SOG layer and a waveguide layer produced by a method, comprising the steps of:

forming the dielectric layer on a substrate;

etching a part of the dielectric layer to form a tapered part;

polishing the dielectric layer to smooth a surface of the dielectric layer and to cause a surface of the tapered part to be slowly curved; and forming the waveguide layer on the dielectric layer.

* * * * *